(12) United States Patent
Houston et al.

(10) Patent No.: US 7,236,396 B2
(45) Date of Patent: Jun. 26, 2007

(54) AREA EFFICIENT IMPLEMENTATION OF SMALL BLOCKS IN AN SRAM ARRAY

(75) Inventors: Theodore W. Houston, Richardson, TX (US); David Barry Scott, Plano, TX (US); Sudha Thiruvengadam, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/171,033

(22) Filed: Jun. 30, 2005

(65) Prior Publication Data

US 2007/0002617 A1    Jan. 4, 2007

(51) Int. Cl.
*G11C 11/34* (2006.01)

(52) U.S. Cl. ............. 365/185.07; 365/154; 365/185.11

(58) Field of Classification Search .................. 365/63, 365/185.07, 185.11, 185.2, 51, 154, 185.06, 365/210; 257/903, 904
See application file for complete search history.

(56) References Cited

U.S. PATENT DOCUMENTS

| | | | | |
|---|---|---|---|---|
| 5,923,593 | A | * | 7/1999 | Hsu et al. .............. 365/189.04 |
| 6,295,222 | B2 | * | 9/2001 | Higashide et al. ............ 365/63 |
| 6,363,027 | B1 | * | 3/2002 | Komatsu ............... 365/230.03 |
| 6,768,144 | B2 | | 7/2004 | Houston et al. |
| 2005/0281098 | A1 | * | 12/2005 | Sadra et al. ................ 365/194 |

OTHER PUBLICATIONS

Fukaura et al., "A Highly Manufacturable High Density embedded SRAM Technology for 90nm CMOS," IEDM 2002.*

* cited by examiner

*Primary Examiner*—Richard T. Elms
*Assistant Examiner*—Alexander Sofocleous
(74) *Attorney, Agent, or Firm*—Jacqueline J. Garner; W. James Brady, III; Frederick J. Telecky, Jr.

(57) ABSTRACT

An SRAM array with a dummy cell row structure in which the SRAM array is divided into segments isolated by a row pattern of dummy cells. The dummy cell structure provides a continuous cell array at the lower cell patterning levels. The SRAM array includes a first and second array block each including an SRAM cell having a first layout configuration, one or more of the dummy cells having a second layout configuration arranged along the row pattern associated with a wordline of the SRAM array, a first power supply voltage line connected to the first array block, and a second different power supply voltage line connected to the second array block. The first and second power supply voltage lines of the array blocks are further connected to the one or more dummy cells.

30 Claims, 16 Drawing Sheets

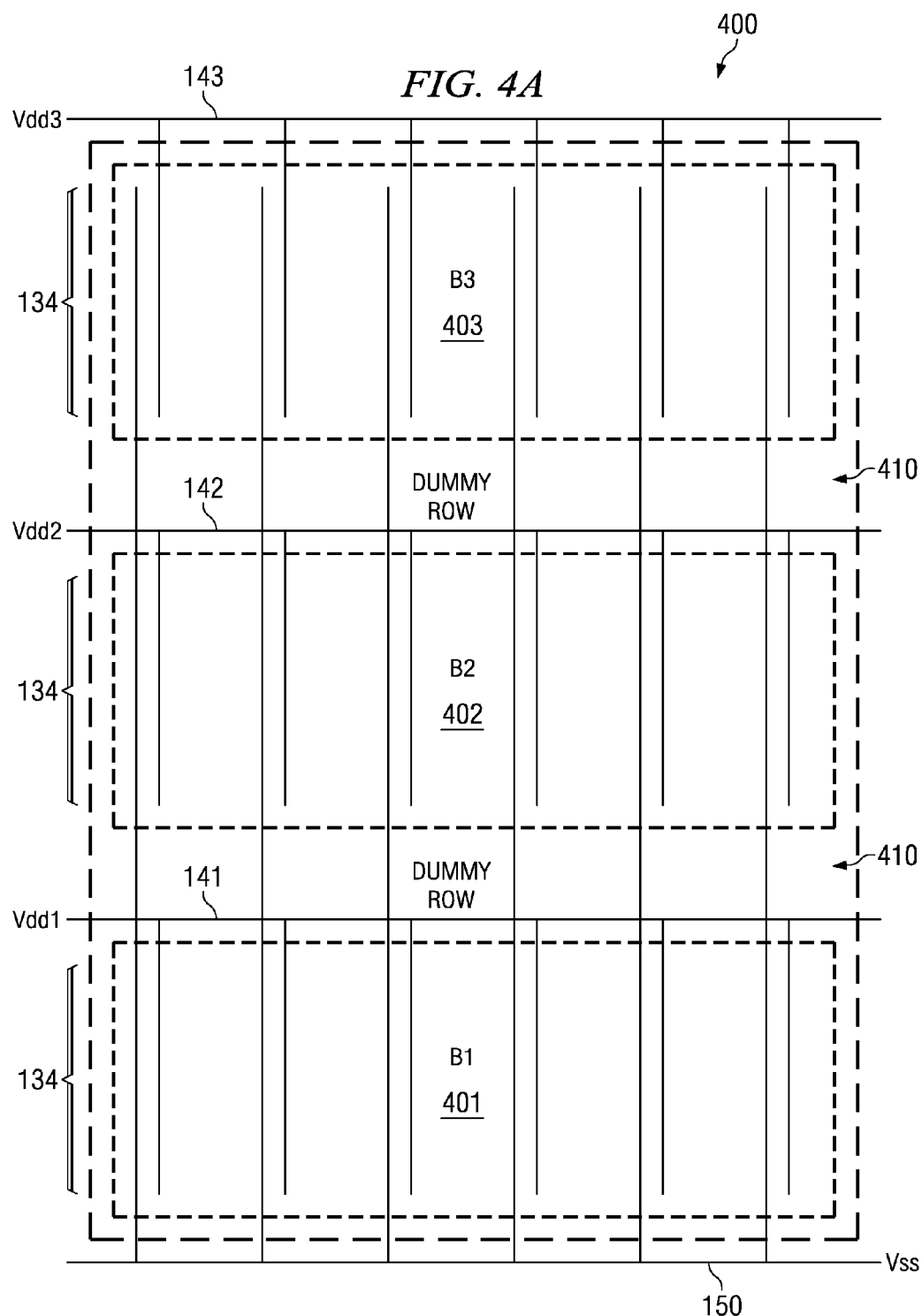

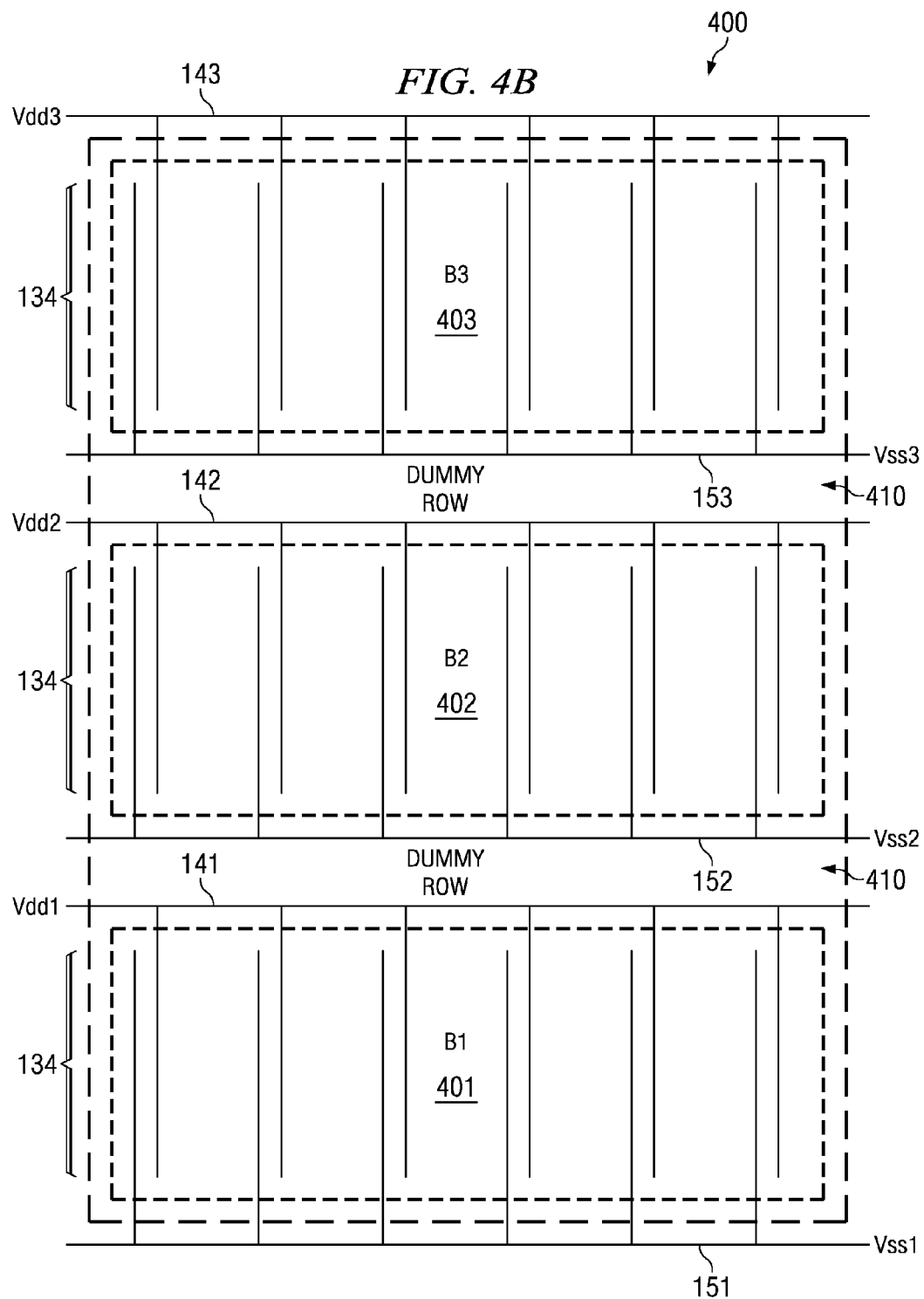

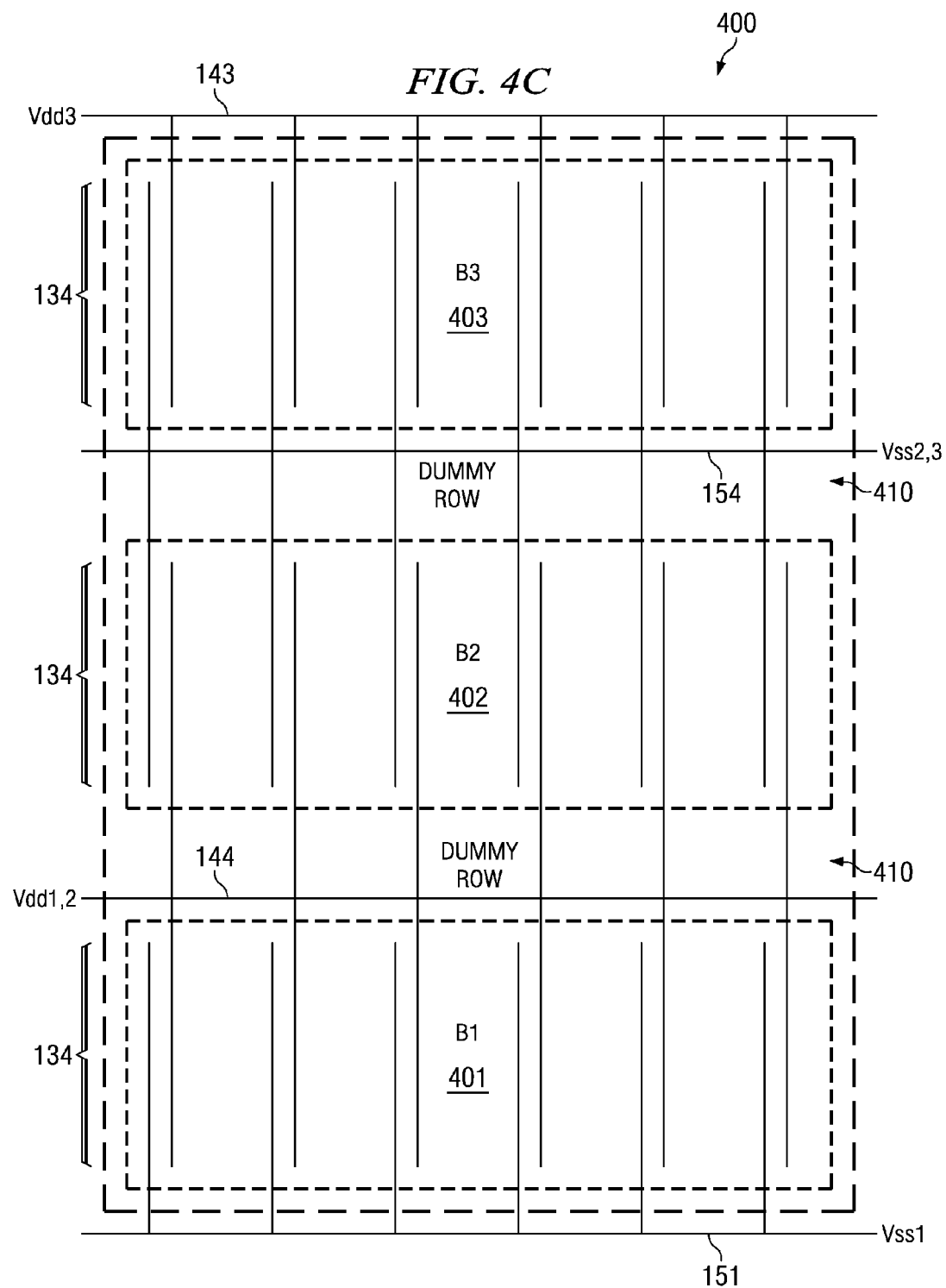

AREA EFFICIENT IMPLEMENTATION OF SMALL BLOCKS IN AN SRAM ARRAY

FIELD OF INVENTION

The present invention relates generally to semiconductor memory devices, and more particularly to structures for segmenting an SRAM array into smaller array blocks using one or more rows of dummy cells of the array for isolating supply lines to the array blocks in the manufacture of semiconductor products.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations.

The basic CMOS SRAM cell generally includes two n-type (nMOS) pull-down or drive transistors and two p-type (pMOS) load transistors in a cross-coupled inverter configuration, with two additional nMOS select or pass-gate transistors added to make up a six-transistor cell (a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation. As transistor feature sizes are continually reduced, however, achieving good, consistent cell patterning that maintains this transistor matching to avoid increased power dissipation is becoming more difficult in SRAM, despite the use of optical pattern correction (OPC) in the photolithographic process.

In operation of SRAM memory arrays, power is generally dissipated in the entire array and peripheral drive/access circuitry even as the array stands idle. This is because in the highest density arrays, power supply lines are shared row to row in common to keep real estate to a minimum. Power dissipation may be reduced while retaining data, by lowering the voltage (e.g., Vss, Vdd) to the array, such as in a data retention mode or sleep mode. In normal operations of the cells, however, a higher voltage is usually again applied to the array, and the cells are accessed via a wordline one row at a time.

Accordingly, for minimum static power dissipation in an SRAM device, it would be desirable to apply full voltage to only the row(s) being accessed, with all other rows of the array in the lower voltage data retention mode. However, the switching between the rows of such an array configuration would add latency and dynamic power. In a prior art, for example, the control of the supply voltage is provided along with the wordline access of a row, keeping the other rows of the array at the lower dissipation voltage. Another problem with this solution is that a significant amount of additional power distribution switching circuitry and wafer real estate must be provided to isolate the power lines between each row of the entire array.

An attractive compromise may be to segment the memory array into relatively small groups of rows wherein the voltage to a group is raised for access and lowered for retention. However, segmenting an array into these relatively small groups of rows may result in inconsistent patterning of the edge rows relative to rows central to the array, and may require significantly more peripheral decoder circuitry and the associated additional area penalty.

Accordingly, there is a need for an area efficient means of isolating power between relatively small groups of rows of an SRAM array while maintaining good pattern uniformity of the cells row to row, equivalent device performance, and minimal power dissipation in the fabrication of SRAM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to a structure used for segmenting an array into smaller array blocks utilizing a dummy cell row structure to isolate the power supply lines of the array segments on either side of the dummy cell row. The dummy cell structure avoids the use of special OPC conditions at the power supply line and block boundaries by maintaining the same pattern uniformity as the adjacent cell rows at the lower cell patterning levels. Thus, the array and dummy cell row structure of the present invention provides a continuous cell array at the cell lower patterning levels in an area efficient implementation in the fabrication of SRAM memory devices. The structures are applicable to silicon wafer fabrication and other such fabrication processes in the manufacture of semiconductor memory devices.

In one aspect of the invention, an SRAM array is formed divided into smaller blocks isolated by a row pattern of dummy cells. The array comprises a first and second array block, each comprising one or more rows of SRAM cells having a first pattern layout configuration. The array also comprises one or more dummy cells having a second layout configuration arranged along the row pattern associated with a wordline of the SRAM array. Finally, the array comprises a first pair of power supply voltage lines (e.g., Vss1, Vdd1) connected to the first array block, and a second different pair of power supply voltage lines (e.g., Vss2, Vdd2) connected to the second array block, wherein the first and second pair of power supply voltage lines of the array blocks connect to the row of the one or more dummy cells. In this way the row of dummy cells isolate the first and second pair of power supply lines of the first and second array blocks.

In another aspect of the invention, the array may further comprise bitlines running continuously across the first and second array blocks and a dummy cell associated therewith. In one aspect of the invention, the first and second layout configurations are substantially the same. For example, the layout pattern of the active region, a gate layer, and a contact layer are substantially the same for the first and second layout configurations corresponding to the dummy cells and the first and second array blocks of the SRAM array.

In still another aspect of the present invention, the power supply line isolation may be accomplished in the contact layer.

In yet another aspect of the present invention, the dummy cell (second) layout configuration, comprises an SRAM cell configuration (e.g., a 6T cell configuration) having two transistor pairs, each pair comprising an NMOS and a PMOS transistor, wherein the gates of the four transistors and the PMOS drains are connected to a single node, and wherein the drain terminals of the PMOS and NMOS transistor in each respective inverter are not connected to one another, thereby avoiding a crowbar current within each inverter when supply voltages applied to the first and second pair of power supply voltage lines are different. Either, or both of the power supply lines (e.g., Vss, Vdd) may be raised or lowered in the dummy cell structure to accomplish the power supply isolation between the array segments.

In another aspect of the present invention, the first and second pair of power supply line connections are accomplished in an overlying metal layer.

In still another aspect of the invention, the wordline associated with the dummy cells is configured to provide one or more of the first and second pair of power supply voltage lines. Alternately, the wordline is connected to a voltage that maintains the dummy cell in an off-state.

In yet another aspect, if both Vss and Vdd are segmented, these supply lines are preferably run across on alternate dummy cell rows.

Fabrication of the array and dummy cell structures in accordance with the present invention, moreover, may also advantageously achieve significantly minimized variations from the desired feature sizing and a corresponding improvement in device performance (e.g., static Iddq (off-state leakage current), and yield roll-off with decreasing pitch) by comparison to those using special boundary-effect OPC considerations.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 4A–4C are simplified diagrams of an SRAM array of cells similar to that of FIGS. 1A, 1B, and 2, each array divided into three array segments by two dummy rows, illustrating a variety of ways that the Vdd and Vss power supply lines may be divided and isolated by the dummy rows according to one or more aspects of the present invention;

DETAILED DESCRIPTION OF THE INVENTION

Figure 1A:
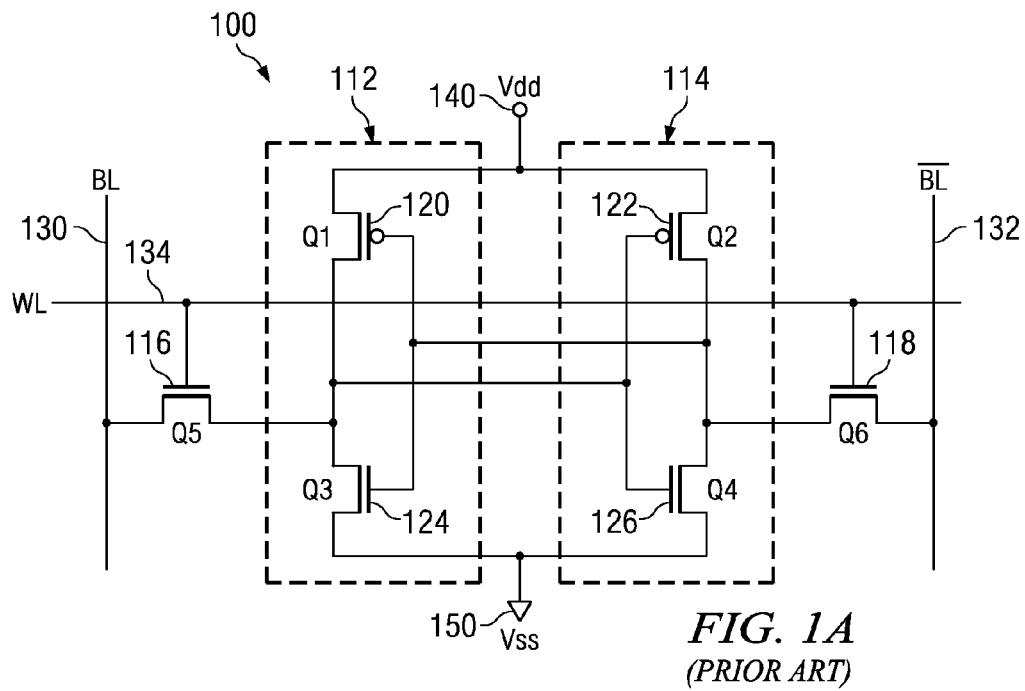
FIG. 1A is a schematic diagram of a 6T static random access memory (SRAM) cell.

The present invention will now be described with reference to the attached drawings, wherein like reference numerals are used to refer to like elements throughout. The invention provides an array structure used for segmenting an array into smaller array blocks, wherein a dummy cell row structure is used to isolate the power supply lines of the array segments on either side of the dummy cell row. The dummy cell structure avoids the use of special OPC conditions at the power supply line and block boundaries by maintaining substantially the same pattern and uniformity as the adjacent cell rows at the lower patterning levels. The dummy cell may be slightly different from the operational cell in the various pattern levels so long as the difference in the dummy cell pattern does not significantly affect the operational cell. In particular, the patterns in the dummy cell may be more significantly different at the M1 and upper metal layers to avoid crowbar currents within and between the inverters of the dummy cells that might otherwise occur when the supply voltages in the adjacent segments differ. Some differences in the patterning at these metal levels, however, will not significantly affect the adjacent operational cell characteristics.

As indicated previously, feature scaling trends continue down to around 50 nm areas or less, wherein patterning variations of features may no longer be ignored particularly in present day SRAM memory circuit layouts requiring close transistor matching to avoid corresponding memory cell switching variations. Further, in memory arrays it is desirable to minimize power dissipation as could be done by lowering supply voltages except for in the row that is accessed. However, as excessive switching logic and die area would be required for switching supply voltages by row, and this switching would add latency and dynamic power, an attractive compromise is segmenting the array into relatively small groups of rows. In response to these problems and issues, the array structures with dummy cell rows of the present invention provide an area efficient means of segmenting such SRAM arrays without compromising the patterning uniformity of the cells.

The inventors of the present invention have realized that by maintaining the same pattern uniformity in the lower layers of the array, that the cell electrical characteristics will remain substantially the same for the array block cells adjacent to the dummy cells since the OPC conditions for these lower layers will remain substantially unchanged (e.g., for lithographic and imaging processing). Therefore, the cells at the edges of the array segment will more closely match those of the cells at the center of the array segment.

The inventors have also realized that the power supply isolation required by the dummy cells may be accomplished preferably within the overlying metal layers, which are not as susceptible to OPC condition variations. Thus, a continuous uniform array is formed in the lower layers using the row of dummy cells to divide the operational SRAM cells into array segments.

To decrease the power consumption of an array, the array may be divided into a plurality of segments, each segment having a different supply voltage line. The plurality of segments of the array remain in a retain till accessed (RTA) mode, wherein most of the SRAM array is held with a reduced power bias (e.g., about 0.5–0.6 volts) in a sleep mode or data retention mode until an array segment is to be accessed in an access mode by supplying that segment with full power (e.g., about 1.1–1.2 volts).

In effect, the dummy cell or cells of the dummy cell row act as a buffer between two adjacent (e.g., first and second) segments of the array. The dummy cell isolates the power supply lines of the first segment from the second segment, while maintaining pattern uniformity, which produces lithographic processing uniformity that results in cell performance uniformity. The dummy cell row, however, is then exposed to the two different voltage levels, the full power voltage on one side from the first segment of the array, and the reduced power bias voltage on the other side from the second segment. This power supply voltage difference within the inverters of the SRAM cell can cause a crow-bar current to the supply (that is, both transistors in an inverter may be at least partially turned on) unless the dummy cell is designed to avoid this potential problem, and as will be discussed infra.

The dummy cell structure provides bitlines common to the plurality of array segments running intact across the dummy cell row(s) or simply dummy row(s). Optionally, the Vdd, Vss, or both Vdd and Vss power supply lines are segmented (e.g., disconnected between segments). The required supply lines (e.g., Vdd, Vss, or both) can be brought across the dummy cell row in place of the word line. If both Vss and Vdd are segmented, it may be preferable to run Vdd and Vss across on alternate dummy rows. In addition, to separate and isolate the segments of the array, one or more dummy cell rows may be used. As the dummy cells are not intended to be functional SRAM memory cells, the pass gates in the dummy cell row can be tied to Vss. If Vss is segmented and raised in unaccessed segments, the dummy cell pass gates may optionally be gated by a periphery Vss.

Exemplary implementations are hereinafter illustrated and described in the context of fabricating dummy cell and array structures to isolate segments of an SRAM array for reducing the overall power dissipation in the array in an area efficient implementation, wherein the structures illustrated are not necessarily drawn to scale. It will be appreciated that the invention may be employed in the fabrication of SRAM memory devices, silicon wafer fabrication and other such fabrication processes in the manufacture of semiconductor memory devices, and other such processes apart from the exemplary memory structures described and illustrated herein. These and other benefits will become more apparent as the following figures are described.

Figure 1B:
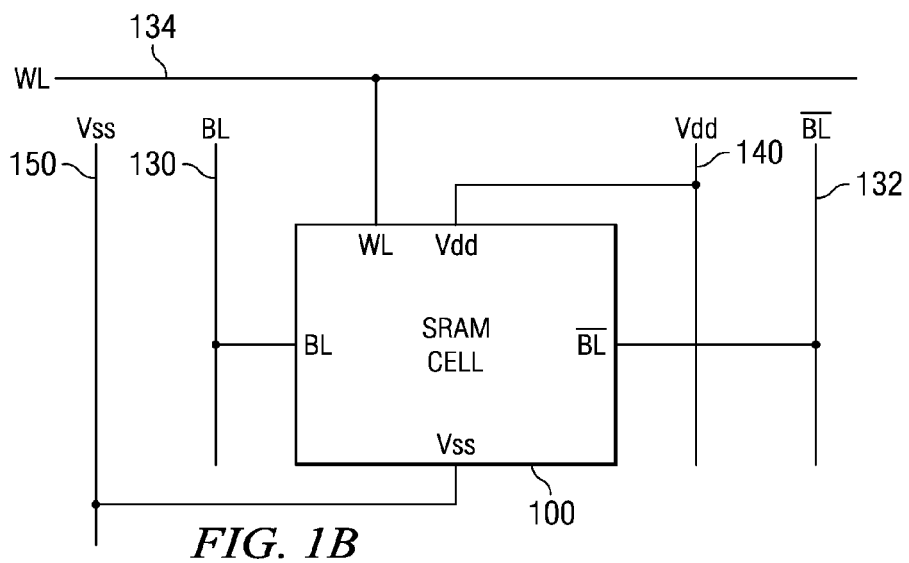
FIG. 1B is a simplified block diagram of the SRAM memory cell of FIG. 1A.

Beginning at FIGS. 1A and 1B an exemplary SRAM circuit 100 is illustrated, such as may be used in association with the present invention, and wherein several aspects of the invention are presented. FIG. 1A illustrates the schematic diagram for the SRAM device 100, while FIG. 1B is a simplified diagram of the SRAM cell 100 of FIG. 1A, illustrating a pair of bitlines (BLs), a wordline (WL) and power supply lines of the SRAM device 100 according to several aspects of the present invention.

FIG. 1A, for example, illustrates a typical static random access memory (SRAM) cell 100. As illustrated, the SRAM cell 100 generally comprises a pair of cross-coupled inverters, for example, inverter A 112, and inverter B 114, comprising a latch operable to store a data bit state. Cell 100 also comprises a pair of pass transistors 116, 118 to read and write a data bit between the cross-coupled inverters 112, 114 and bitlines BL 130, BL-bar 132, when enabled by wordline 134. Respective inverters A 112, B 114 comprise a p-type MOS (pMOS) pull-up or load transistor Q1 120, Q2 122 and an n-type (nMOS) pull-down transistor Q3 124, Q4 126. Transistors Q5 116, Q6 118 are generally n-type as well. Pass transistors 116, 118 are enabled by wordline 134 and accessed by bitlines 130, 132 to set or read the SRAM latch 100. FIGS. 1A and 1B further illustrate that inverters 112, 114 of the SRAM memory cell 100 are connected together to a single Vdd drain power supply line 140 and a single Vss source power supply line 150.

This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.). Those familiar with the art will recognize that this invention applies to other variations of SRAM arrays.

In general, SRAM cells are more stable and have better data retention where the respective pMOS (120, 122) and nMOS (124, 126) transistors are matched for the two inverters (112, 114). However, as dimensions are reduced to scale down devices, cell pattern non-uniformity and pattern misalignments can become an issue that adversely affects transistor matching. As a result, the SRAM cells can be adversely affected by operating characteristics that vary from transistor to transistor. For example, such SRAM may be unstable and not retain the desired bit state (e.g., a logic 1 instead of a logic 0 or vice versa).

Figure 2:
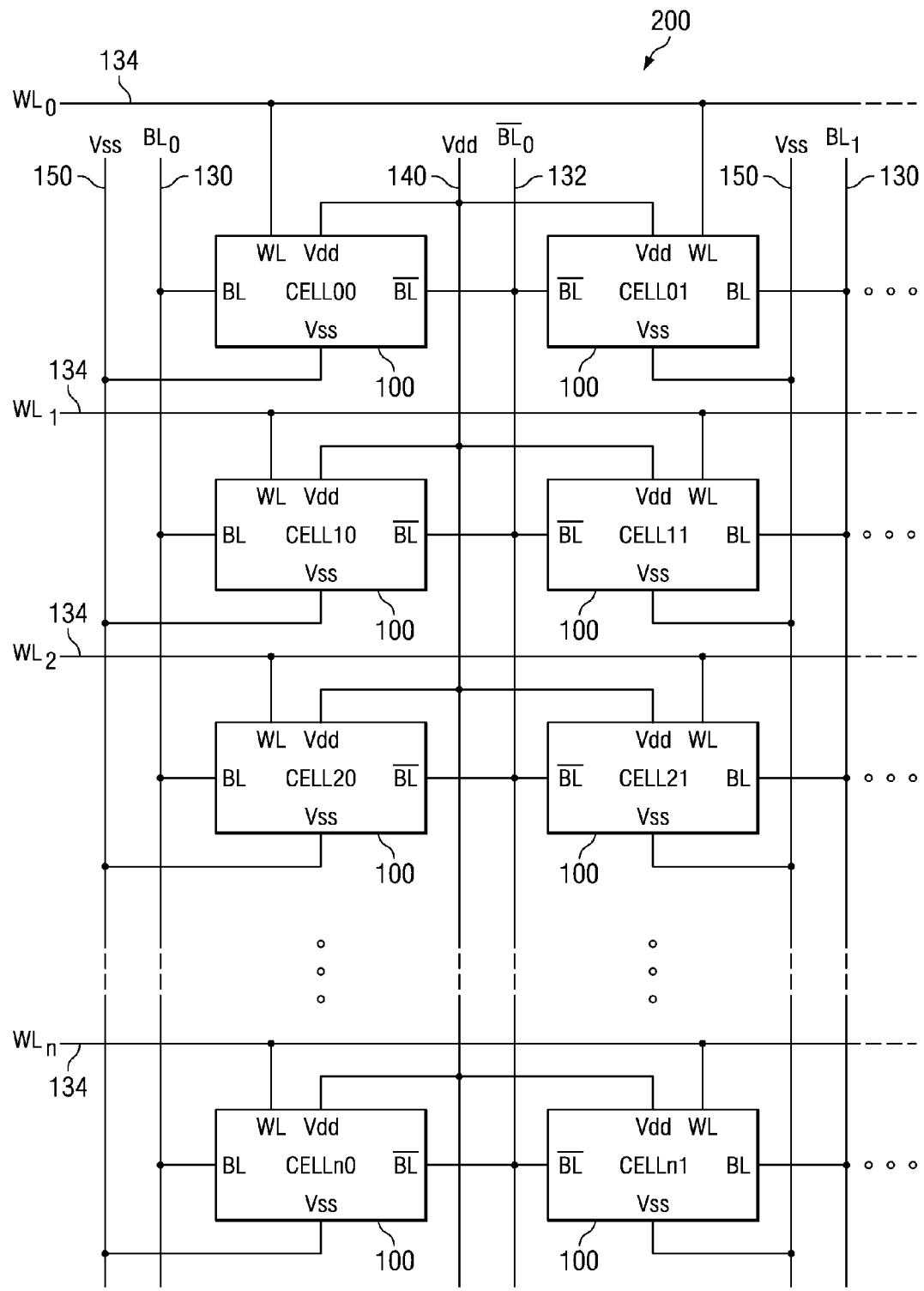
FIG. 2 is a simplified block diagram of an 2×n SRAM array using the SRAM cell of FIGS. 1A and 1B.

FIG. 2 illustrates a 2×n SRAM array 200 using memory cells similar to that of SRAM cell 100 of FIGS. 1A and 1B. SRAM array 200 illustrates two columns of cells 100, each column associated with a pair of bitlines BLs, with n rows of cells 100, each row of the array 200 associated with a wordline $WL_0-WL_n$ 134 of the array 200. Since no array segmentation is utilized, all the SRAM memory cells 100 (e.g., Cell00–Celln1) of array 200 may be connected to a single Vdd power supply line 140 and a single Vss power supply line 150.

Figure 3:
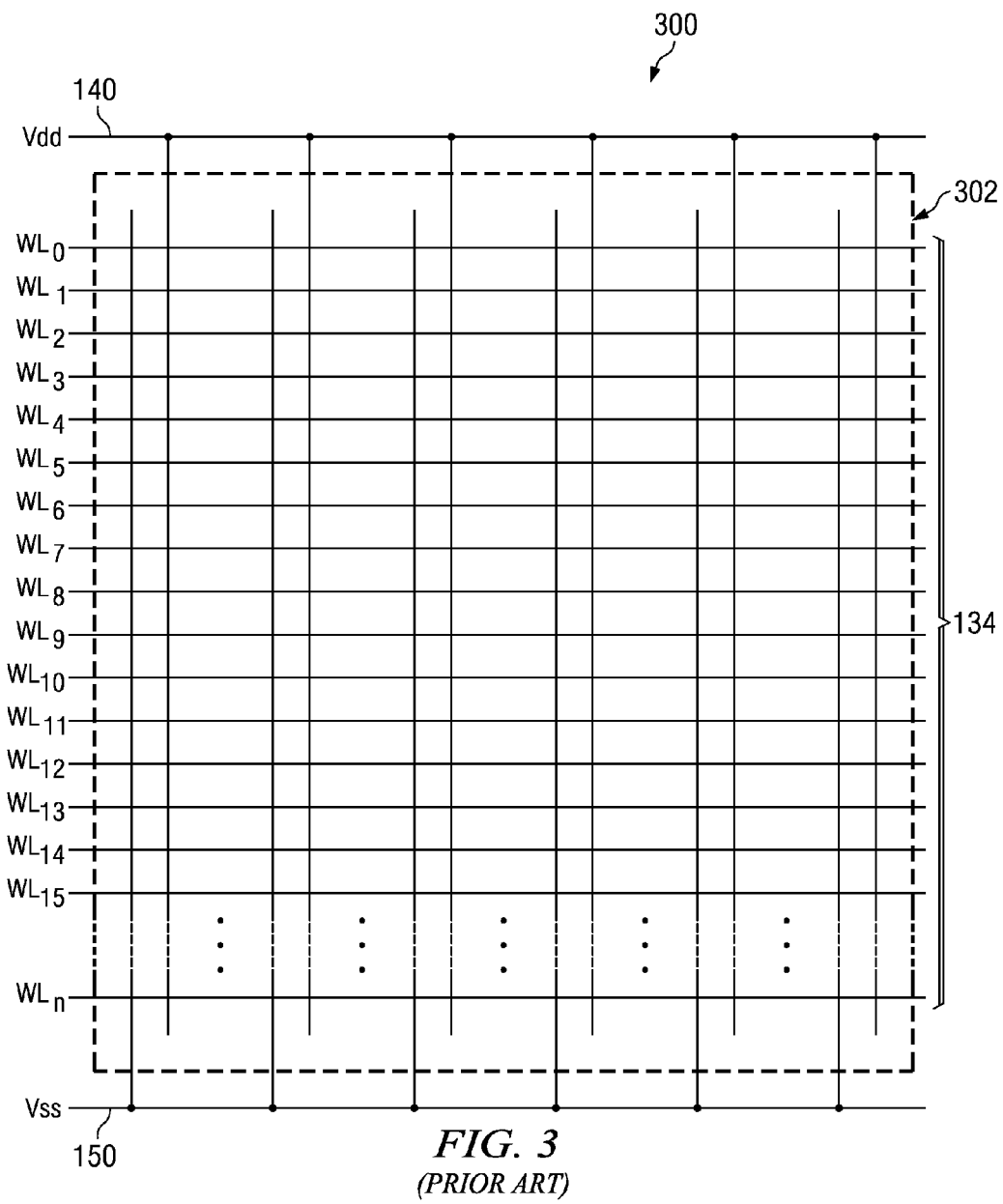
FIG. 3 is another simplified diagram of an SRAM array using the SRAM cells of FIGS. 1A, 1B, and 2, illustrating an array comprising n wordlines and a plurality of Vdd and Vss power supply lines.

FIG. 3, also illustrates another SRAM array 300 of cells (the individual cells are not shown here for simplicity) similar to those of FIGS. 1A, 1B, and 2. SRAM array 300 comprises a single array segment or block 302 having n wordlines $WL_0-WL_n$ 134 and again, since no array segmentation is utilized, only a single Vdd and Vss power supply line 140, 150, respectively, is used. FIG. 3 illustrates the single Vdd and Vss power supply lines respectively, as a plurality of interconnected conductors interlacing throughout the array to supply the n cells.

FIGS. 4A–4C illustrates other exemplary SRAM arrays of cells similar to those of FIGS. 2 and 3 in accordance with several aspects of the present invention. Each array 400, is divided into three array segments or blocks B1 401, B2 402, B3 403 by a dummy row 410 between adjacent array segments (e.g., B1–B2, and B2–B3). Each array segment B1 401, B2 402, B3 403 comprises a group of one or more rows of standard or operational SRAM cells 100 accessed by associated wordlines 134. FIGS. 4A–4C further illustrate several exemplary ways that the Vdd 140 and Vss 150 power supply lines of FIG. 3 may be divided and isolated by the dummy rows 410 to segment the array 400 according to one or more aspects of the present invention.

As indicated previously, the dummy cell row(s) 410 separates the power supply lines of each array segment. The result of the dummy cell row(s) is a continuous cell array at the lower levels. Thus, for the lower levels, there is no special OPC conditions at the array segment or block boundaries.

Although the dummy row 410 will be discussed in the context of a single row of dummy cells 100, it is appreciated by the inventor that one or more dummy cell rows may also be utilized to isolate the array segments 401, 402, 403 of the array 400, particularly when the wordline 134 of the dummy cell row(s) 410 is utilized to pass two power supply lines. Further, the array 400 may be oriented in another direction wherein the wordlines 134 and dummy cell rows 410 are oriented vertically, or another such direction rather than horizontally, and such variations of array orientation are anticipated.

For example, FIG. 4A illustrates an SRAM array 400 wherein the Vdd power supply line 140 is segmented by dummy cell row(s) 410 into Vdd1 141, Vdd2 142, and Vdd3 143 to the three array segments or blocks B1, B2, and B3, respectively, while the Vss 150 power supply line is not segmented. Alternately (but not shown), the Vss150 power supply line may be segmented by dummy cell row(s) 410 into Vss1 151, Vss2 152, and Vss3 153 to the three array segments B1, B2, and B3, respectively, while the Vdd 140 power supply line is not segmented. Although FIG. 4A illustrates a power supply line passing along the dummy cell row(s) 410 and/or the wordline 134 of the dummy cell row 410, other upper metal layers may also be utilized for the power supply line as will be discussed further infra.

FIG. 4B illustrates the SRAM array 400 wherein both the Vdd and Vss power supply lines are segmented by dummy cell row(s) 410 in accordance with another exemplary implementation of the present invention. In FIG. 4B Vdd power supply line 140 is segmented by dummy cell row(s) 410 into Vdd1 141, Vdd2 142, and Vdd3 143 to the three array segments or blocks B1, B2, and B3, respectively, and the Vss150 power supply line is segmented by dummy cell row(s) 410 into Vss1 151, Vss2 152, and Vss3 153 to the three array segments B1, B2, and B3, respectively. In this example, two power supply lines (e.g., Vdd1 141 and Vss2 152, or Vdd2 142 and Vss3 153) pass horizontally along the dummy cell row(s) 410. Although FIG. 4B illustrates two power supply lines passing along the dummy cell row(s) 410 and/or the wordline 134 of the dummy cell row 410, other upper metal layers may also be utilized for the power supply lines as will be discussed further infra.

FIG. 4C illustrates the SRAM array 400 wherein both the Vdd and Vss power supply lines are alternately segmented by dummy cell row(s) 410 in accordance with another exemplary implementation of the present invention. In FIG. 4C Vdd power supply line 140 is segmented by dummy cell row(s) 410 into Vdd1,2 144 to the two array segments B1 and B2, and Vdd3 143 to array segment B3, respectively, and the Vss150 power supply line is segmented by dummy cell row(s) 410 into Vss1 151 to array segment B1, and Vss2,3 154 to the two array segments B2 and B3, respectively. In this example, only one power supply line (e.g., Vdd1,2 144, or Vss2,3 154) passes horizontally along the dummy cell row(s) 410, or alternately at an upper metal layer.

Note, in each of the examples of FIGS. 4A–4C, that the cells of the dummy cell row(s) 410 are exposed to and therefore isolates two or more separate voltages from the adjacent array segments (above and below the dummy row in the exemplary illustration). For example, in FIG. 4A, between array segments B1 and B2, dummy cell row 410 isolates Vdd1 of array segment B1 from Vdd2 of array segment B2. In the example of FIG. 4B, between adjacent array segments B1 and B2, dummy cell row 410 isolates four voltages: Vdd1 and Vss1 of array segment B1 from Vdd2 and Vss2 of array segment B2. Thus, both Vdd and/or Vss may be segmented and isolated by a dummy cell row 410. The following figures will illustrate how this isolation is accomplished in accordance with the present invention.

Figure 5A:
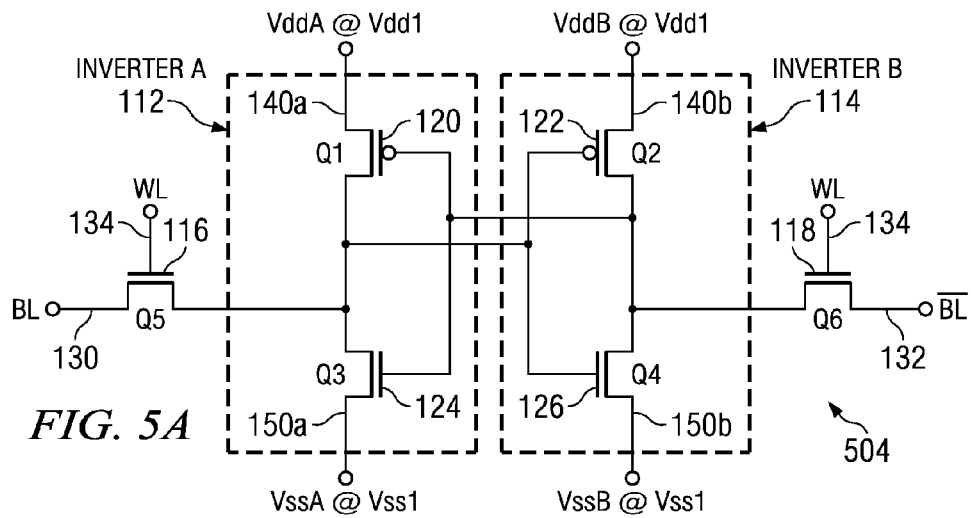
FIGS. 5A and 5B are schematic diagrams of a 6T SRAM cell similar to that of FIGS. 1A, 1B, and 2, the cell structure having separate Vdd and Vss power supply lines to each inverter such as may be used in the SRAM array segments and the dummy cell rows in accordance with several aspects of the present invention.
Figure 5B:
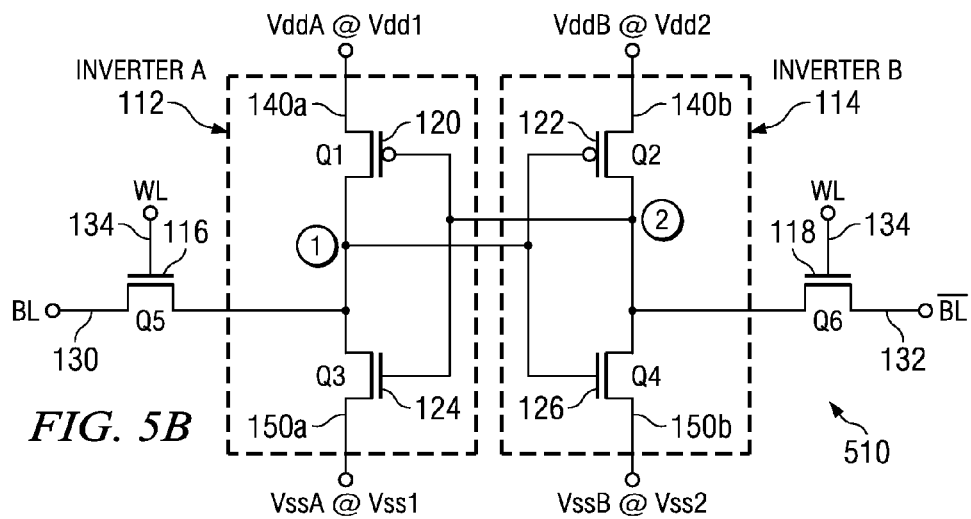

FIGS. 5A and 5B illustrate a basic 6T SRAM cell similar to that of FIGS. 1A, 1B, and 2 such as may be used in the SRAM array segments and the dummy cell rows in the array 300 of FIG. 3 or array 400 of FIGS. 4A–4C in accordance with one or more aspects of the present invention. FIGS. 5A and 5B, similar to the SRAM cell of FIG. 1A, illustrates two cross-coupled inverters, wherein the drain outputs of inverter A 112 are cross-coupled to the gate connections of inverter B 114, and the drain outputs of inverter B 114 are cross-coupled to the gate connections of inverter A 112. In contrast to the SRAM cell 100 of FIG. 1A, the Vdd and Vss supply lines of SRAM cell 504 of FIGS. 5A and 510 of FIG. 5B, are not connected in order to separately feed each corresponding inverter A 112, and B 114, respectively. The SRAM cell 504 comprises separate power supply lines VddA 140a and VssA 150a to inverter A 112, and power supply lines VddB 140b and VssB 150b to inverter B 114, respectively.

Exemplary cell 504 of FIG. 5A, illustrates a single voltage (e.g., Vdd1) applied to both VddA 140a and VddB 140b power supply lines of inverter 112 and 114, respectively. Further, cell 504 illustrates a single voltage (e.g., Vss1) is applied to both VddA 140a and VddB 140b power supply lines of inverter 112 and 114, respectively. This is the power supply situation of an SRAM cell as it may be used in the array segments. Further, depending on the M1 or another metal layer wiring interconnection, this cell may further have inverters 112, 114 supply line 140a wired to supply line 140b, and/or inverters 112, 114 supply line 150a wired to supply line 150b for example, when the cell is used in the array segments on either side of the dummy cell row 410.

Exemplary cell 510 of FIG. 5B, by contrast, illustrates the supply voltage situation presented to a dummy cell, wherein different supply voltages (e.g., Vdd1, and Vdd2) are applied to VddA 140a and VddB 140b power supply lines of inverter 112 and 114, respectively, and wherein different supply voltages (e.g., Vss1, and Vss2) are applied to VssA 150a and VssB 150b power supply lines of inverter 112 and 114, respectively.

However, if a dummy cell of a dummy cell row 410, were used as shown in FIG. 5B, there is a possibility of a crow-bar current when the Vss voltages or the Vdd voltages of adjacent array segments are different. That is, a current may flow in inverter A 112 from VddA power supply line 140a through transistor Q1 and Q3 (node 1) to VssA power supply line 150a, or from VddB power supply line 140b through transistor Q2 and Q4 (node 2) to VssB power supply line 150b. Such detrimental crow-bar currents will dissipate power and may tend to short the supply voltages.

The crow-bar current may be explained as follows: if the voltage on node 1 of inverter A 112 is between Vdd2 and Vss2, both the PMOS and the NMOS transistors Q2 and Q4, respectively, of inverter B 114 will be somewhat "on" (partially conducting), and there will be a crow-bar current from VddB to VssB, and therefore from Vdd2 to Vss2. Such a condition could occur if Vdd1 is lowered (or Vss1 is raised) relative to the operating voltages, while Vdd2 and Vdd1 are kept at operating voltages.

Figure 5C:
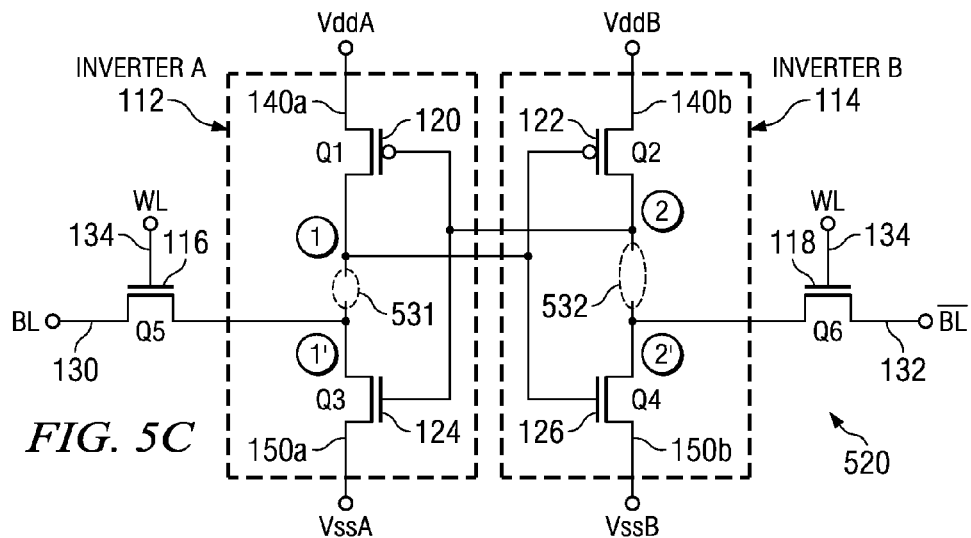
FIG. 5C is a schematic diagram of a 6T SRAM dummy cell structure having separate Vdd and Vss power supply lines to each inverter, wherein the drain terminals of the PMOS and NMOS transistor in each respective inverter are not connected to one another to avoid a crowbar current within each inverter when supply voltages applied to the first and second power supply voltage lines are different in accordance with several aspects of the present invention.
Figure 5D:
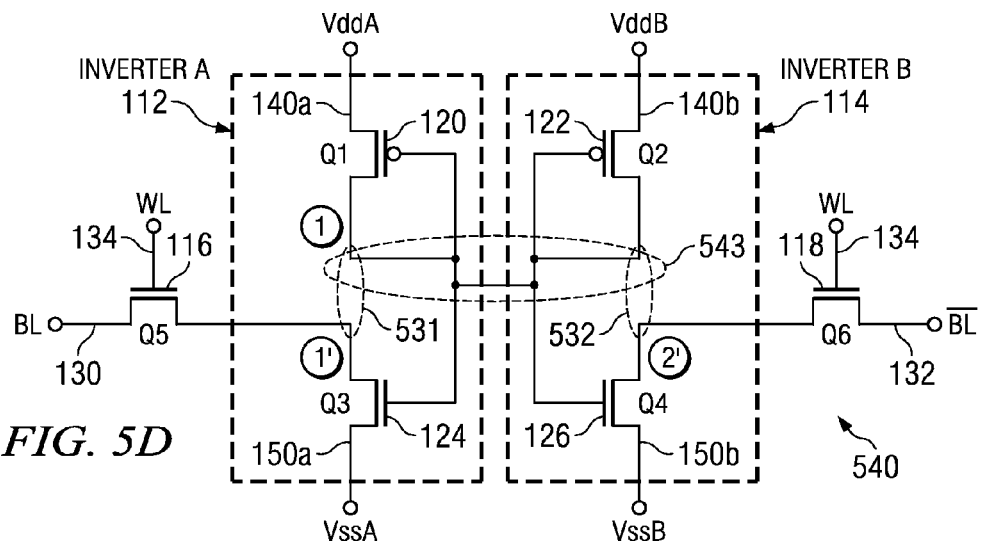
FIG. 5D is a schematic diagram of a 6T SRAM dummy cell structure having separate Vdd and Vss power supply lines to each inverter, wherein the drain terminals of the PMOS and NMOS transistor in each respective inverter are not connected to one another to avoid a crowbar current within each inverter when supply voltages applied to the first and second power supply voltage lines are different, and wherein the gates of the four inverter transistors and the cross-coupling connections are connected to a single node to stop a current between VddA and VddB in accordance with several aspects of the present invention.

To avoid such crow-bar currents in the dummy cell, a new layout is proposed wherein interconnection changes are made as shown in FIGS. 5C and 5D. First, as illustrated in SRAM cell 520 of FIG. 5C, the possibility of crow-bar current can be eliminated by producing openings 531 and 532 in both of the NMOS to PMOS transistor connections of inverter A 112 and B1 14, respectively. As is shown in FIG. 5B, these connections otherwise comprise the drain interconnection between Q1 and Q3 for inverter A 112 at node 1, and the drain interconnection between Q2 and Q4 for inverter B 114 at node 2. FIG. 5C further illustrates that opening 531 creates a node 1 and a node 1', while opening 532 creates a node 2 and a node 2' at the pass gate transistor (e.g., Q5 and Q6) to NMOS pull-down transistor (e.g., Q3 and Q4) connection of the respective inverters 112 and 114.

Second, to facilitate the layout, SRAM cell 540 of FIG. 5D illustrates that nodes 1 and 2 (of FIG. 5C) may be shorted to a single node (e.g., node 1) 543 in accordance with several aspects of the present invention providing a crow-bar protected dummy cell 540. Thus, the drains of the PMOS transistors and the gates of the four inverter transistors Q1–Q4 are shorted together 543. In the new layout for the crow-bar protected dummy cell 540, the openings 531 and 532, and shorting 543 may be accomplished in the M1 metal layer, and are patterned to keep the M1 density fairly uniform, as will be shown later in FIG. 8 infra. Alternately, another such modification of this SRAM transistor design may avoid this crow-bar current, and is anticipated in the context of the present invention.

In these two interconnection and corresponding layout changes, clearly, no crow-bar currents are produced when Vdd1=Vdd2 while only Vss1 or Vss2 is changed. Additionally, if Vdd1 is not equal to Vdd2, one or the other of the PMOS transistors will be off, stopping current between Vdd1 and Vdd2. The application of such Vdd and Vss voltages may be more clearly understood in association with the discussion of FIG. 6.

Figure 6:
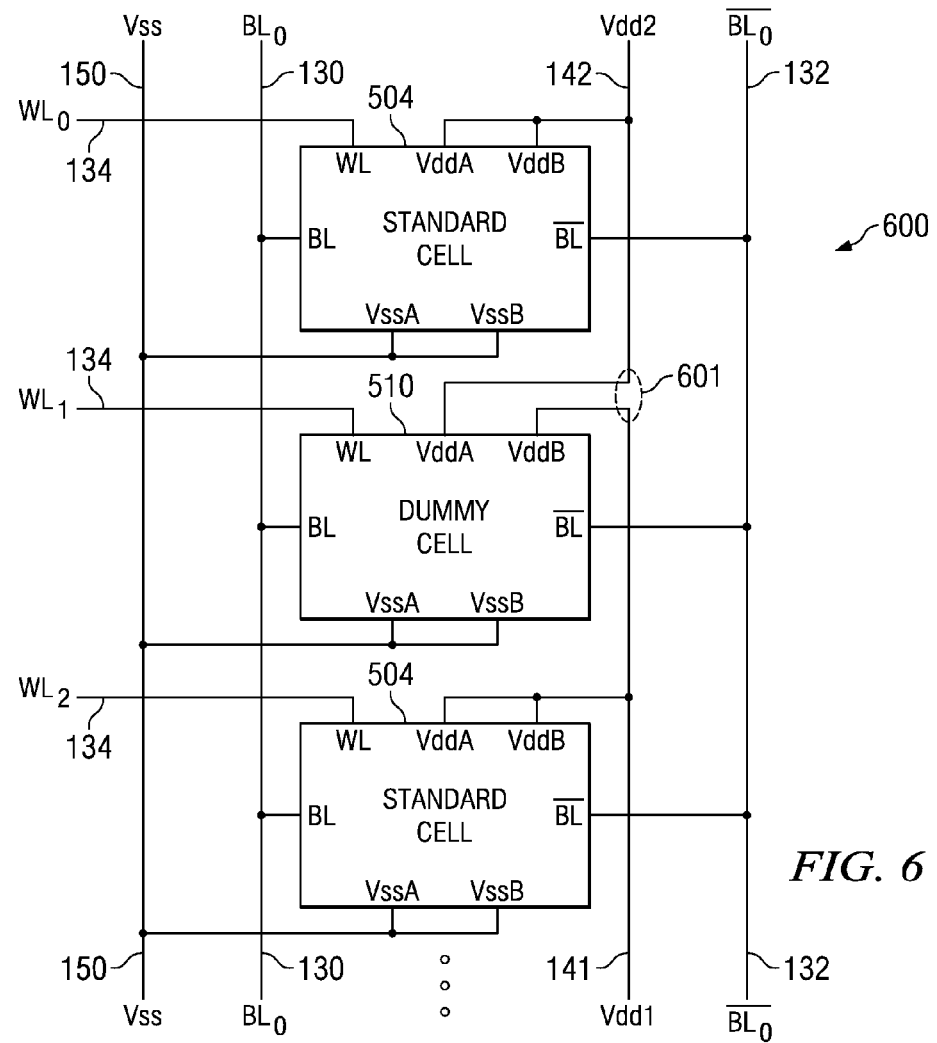
FIG. 6 is a simplified block diagram of an array of three SRAM cells similar to those of FIGS. 1A, 1B, 2, 5A, and 5B, the cell structures having separate Vdd and Vss power supply lines to each inverter, further illustrating the separate power supply lines shorted together on the "standard cell" used in the SRAM array segments, and illustrating the power supply lines running to two separate Vdd supply voltages in the dummy cell in accordance with several aspects of the present invention.

FIG. 6 illustrates an array 600 of three SRAM cells similar to those of FIGS. 1A, 1B, 2, 5A, and 5B in accordance with several aspects of the present invention, wherein only Vdd is segmented. The cell structures of FIG. 6 each comprise a pair of separate Vdd (VddA and VddB) and a pair of separate Vss (VssA and VssB) power supply lines to each inverter. FIG. 6 further illustrates that each pair of power supply lines are connected to a single power supply line on the SRAM cells 504 used in the SRAM array segments, whereas in the SRAM cell 510 used as a dummy cell 510 of a dummy cell row, at least one pair of power supply lines runs to two separate Vdd supply voltages as shown at 601, such as in the array 400 of FIG. 4A. Although an unprotected SRAM cell 510 is referenced in the present example, it is understood that a crow-bar protected dummy cell, such as cell 520 or cell 540 or other cells as anticipated, may also be utilized in the array 600 of FIG. 6, and that the present example is chosen to better match with the figures to immediately follow.

Figure 7A:
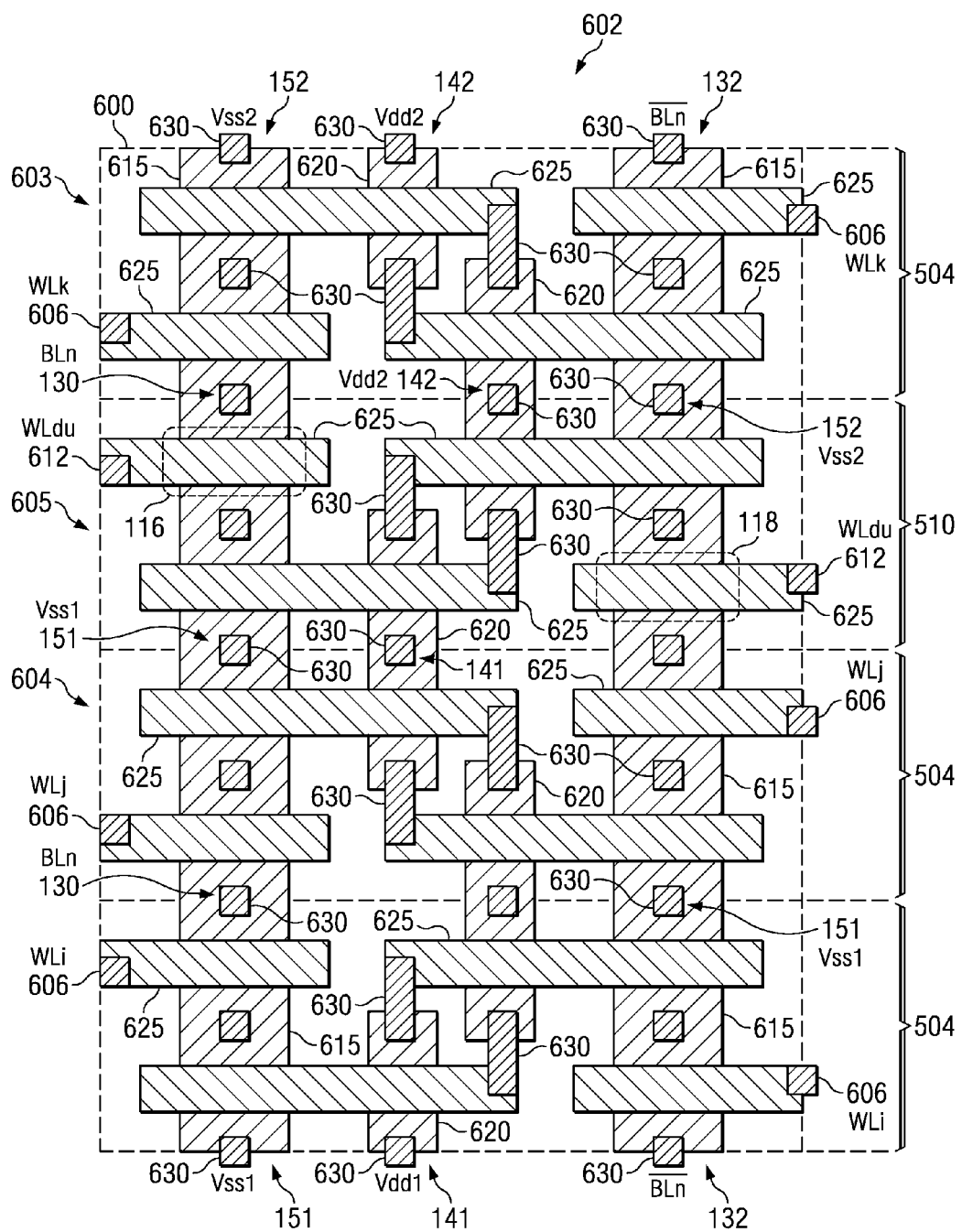
FIG. 7A is a top plan view of the layout patterns of four cells of an SRAM array illustrating the first three patterning layers of the array that includes three standard array cells and a dummy cell such as those of the array of FIG. 6, one array cell of a first array segment above the dummy cell, and two array cells of a second array segment below the dummy cell according to one or more aspects of the present invention, wherein the layout patterns of the array cells and the dummy cell are substantially identical.

FIG. 7A illustrates a layout pattern 602 for four cells of the SRAM array 600 of FIG. 6 and further illustrating the first three patterning layers of the array 600 according to one or more aspects of the present invention. The array 600 includes three SRAM cells 504 used in array segments adjacent to the dummy cell 510 associated with a row of dummy cells. In the array 600, one cell 504 of a first array segment 603 is above the dummy cell 510, and two cells 504 of a second array segment 604 are below the dummy cell 510 or dummy cell row 605.

Array 600 of FIG. 7A is accessed by array segment wordlines WLi, WLj, WLk 606, dummy wordline WLdu 612, and by bitlines BLn 130 and BLn-bar 132. The first (lowest) patterning layer comprises the active regions of the SRAM transistors formed within a semiconductor substrate of the array 600, comprising both the NMOS active region 615 and the PMOS active region 620. The second patterning layer comprises the gate layer 625 overlying the active regions 615 and 620. The third patterning layer comprises the contact layer 630, which is formed over the gate layer 625 and the active regions 615 and 620 to connect the features formed in these first three lower layers to the overlying upper metal layers.

As may be observed in FIG. 7A, the layout patterns of the array segment cells 504 and the dummy cell 510 are substantially identical within the first three patterning layers. Because the individual cell patterns of array 600 are substantially identical within the first three patterning layers and because these layers are generally considered the most critical to transistor matching characteristics, no special OPC considerations are needed between array segments patterned and isolated in this manner.

Figure 7B:
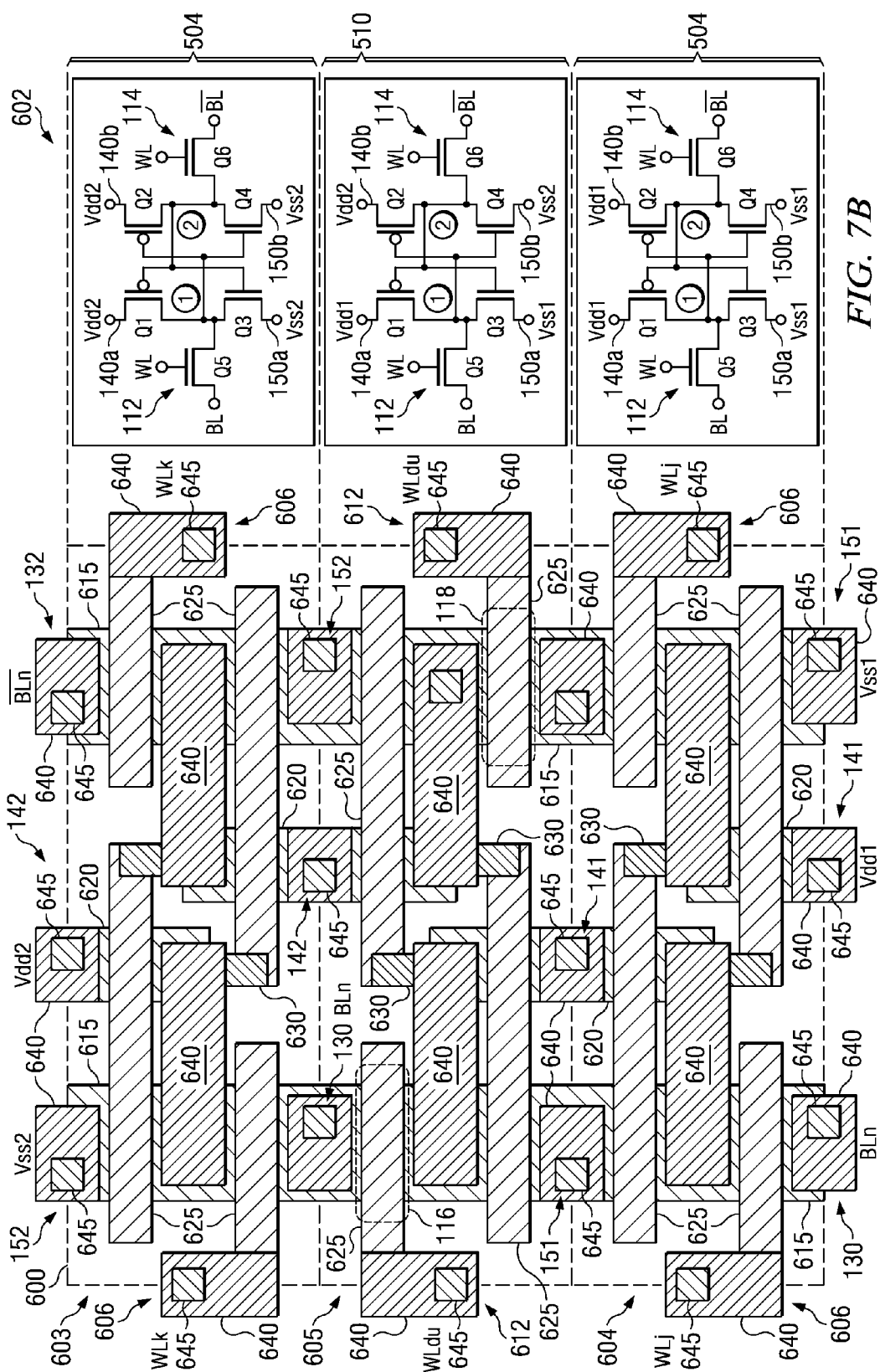
FIG. 7B is a top plan view of the layout patterns and respective schematic diagrams of three cells of an SRAM array illustrating the first five patterning layers of the array that includes two standard array cells and a dummy cell such as those of the array of FIG. 6, one array cell of a first array segment above the dummy cell, and one array cell of a second array segment below the dummy cell according to one or more aspects of the present invention, wherein the layout patterns of the array cells and the dummy cell are substantially identical.

FIG. 7B illustrates the exemplary layout pattern 602 and respective schematic diagrams of three cells of the SRAM array 600 of FIGS. 6 and 7A, illustrating the first five patterning layers of the array 600 according to one or more other aspects of the present invention. In addition to the patterning layers of FIG. 7A, the fourth patterning layer comprises the M1 metal layer 640 that interconnects various elements of the cell at the contact layer 630, such as the transistor gate interconnections or the NMOS to PMOS drain interconnections. The fifth patterning layer comprises the Via1 layer 645 that permits interconnections to the upper metal layers for the power supply line interconnections.

The array 600 of FIG. 7B further illustrates that in the layout patterns of the respective first and second segment 603 and 604 array cells 504 are also substantially identical to those of the dummy cell 510 at the M1 metal layer. However, as previously discussed, in association with FIGS. 5B–5D, the possibility of crow-bar currents within and between the inverters of the dummy cell 510 associated with a row of dummy cells 605, may make this unmodified pattern less valuable.

Figure 8:
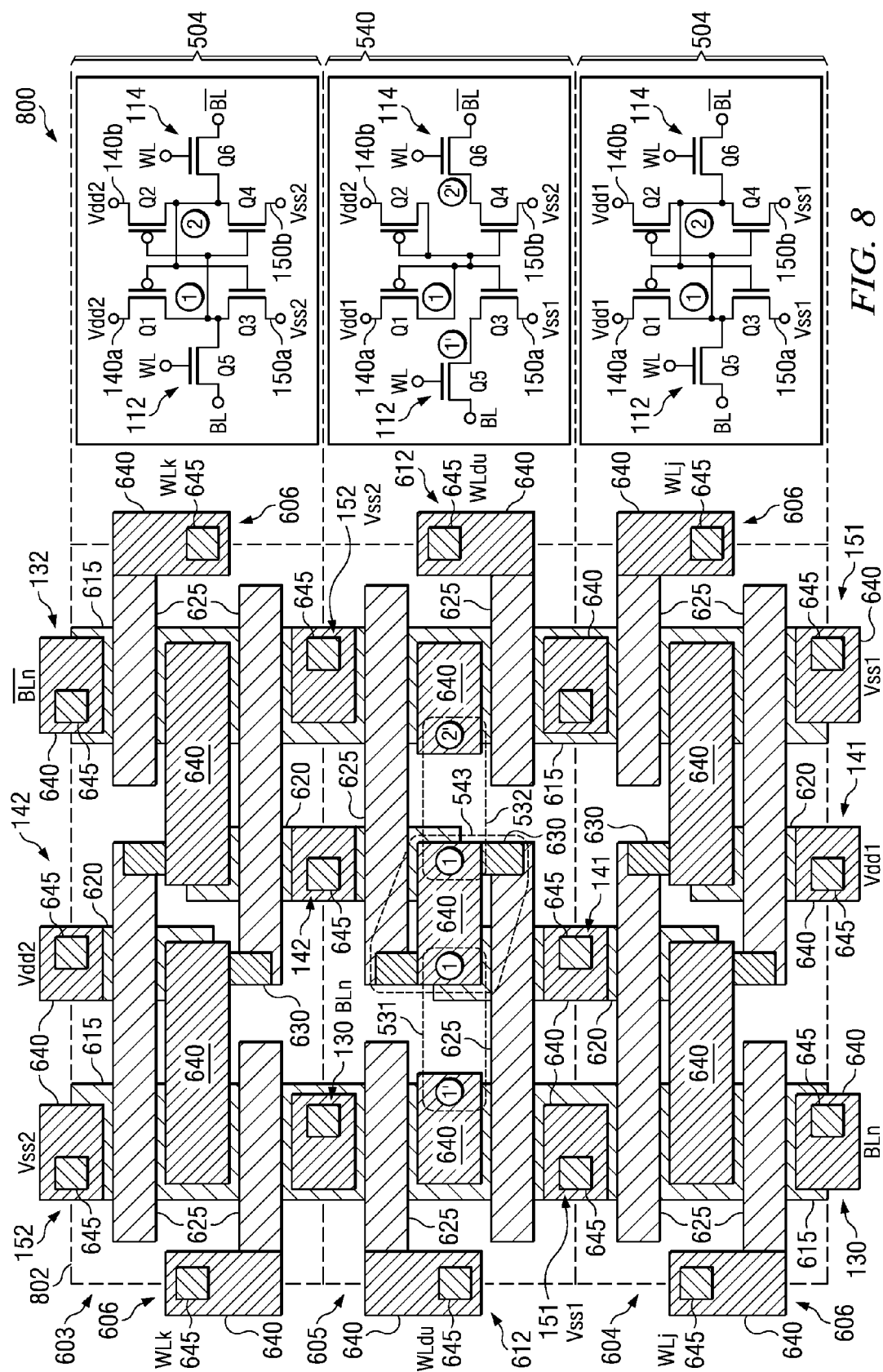
FIG. 8 is a top plan view of exemplary layout patterns and respective schematic diagrams of three cells of an SRAM array illustrating the first five patterning layers of the array that includes two standard array cells and a dummy cell patterned according to the dummy cell of FIG. 5D, one array cell of a first array segment above the dummy cell, and one array cell of a second array segment below the dummy cell according to one or more aspects of the present invention, wherein the layout patterns of the array cells and the dummy cell differ at the M1 metal layer.

FIG. 8 illustrates another exemplary layout pattern 800 and respective schematic diagrams 504 and 540 of three cells of an SRAM array 802 similar to the array 600 of FIGS. 6 and 7A, illustrating the first five patterning layers of the array 800 according to one or more other aspects of the present invention. Layout pattern 800 is similar to that of array 602 of FIG. 7B, and as such need not be fully described again for the sake of brevity. By contrast to array 600 of FIG. 7B, however, the array 800 of FIG. 8 illustrates that the layout pattern of the dummy cell 540 differs from the layout pattern of the array cells 504 at the M1 metal layer according to the crow-bar protection modifications shown in dummy cell schematic 540 of FIG. 5D. In particular, openings 531 and 532 are circled on the layout to identify the areas of the M1 layer 640 that are opened, while short 543 is circled to identify the four gates and two drains of node 1 that are shorted to a single node.

In total, the openings 531, 532, and the short 543 provide approximately the same M1 640 density in the circuit areas which may be affected, thereby minimizing the OPC and the associated circuit effects to the dummy cell and the adjacent array segments.

Figure 9:
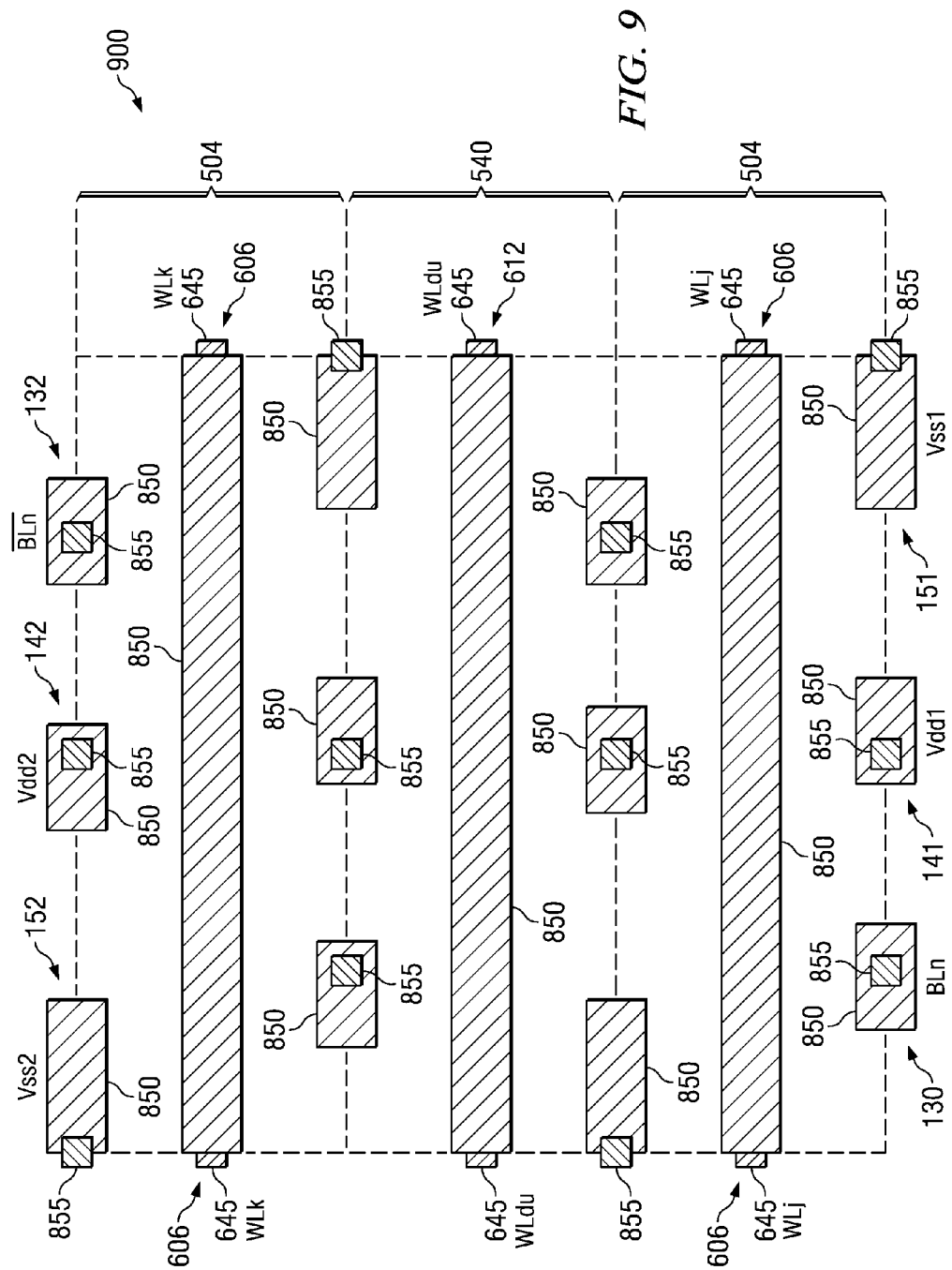
FIG. 9 is a top plan view of exemplary layout patterns of the SRAM array of FIG. 8, illustrating several overlying metal layers that function as the wordlines, bitlines and power supply lines to the two standard array cells and the dummy cell, according to one or more aspects of the present invention, wherein the layout patterns of the array cells and the dummy cell differ at the M1 metal layer.
Figure 10:
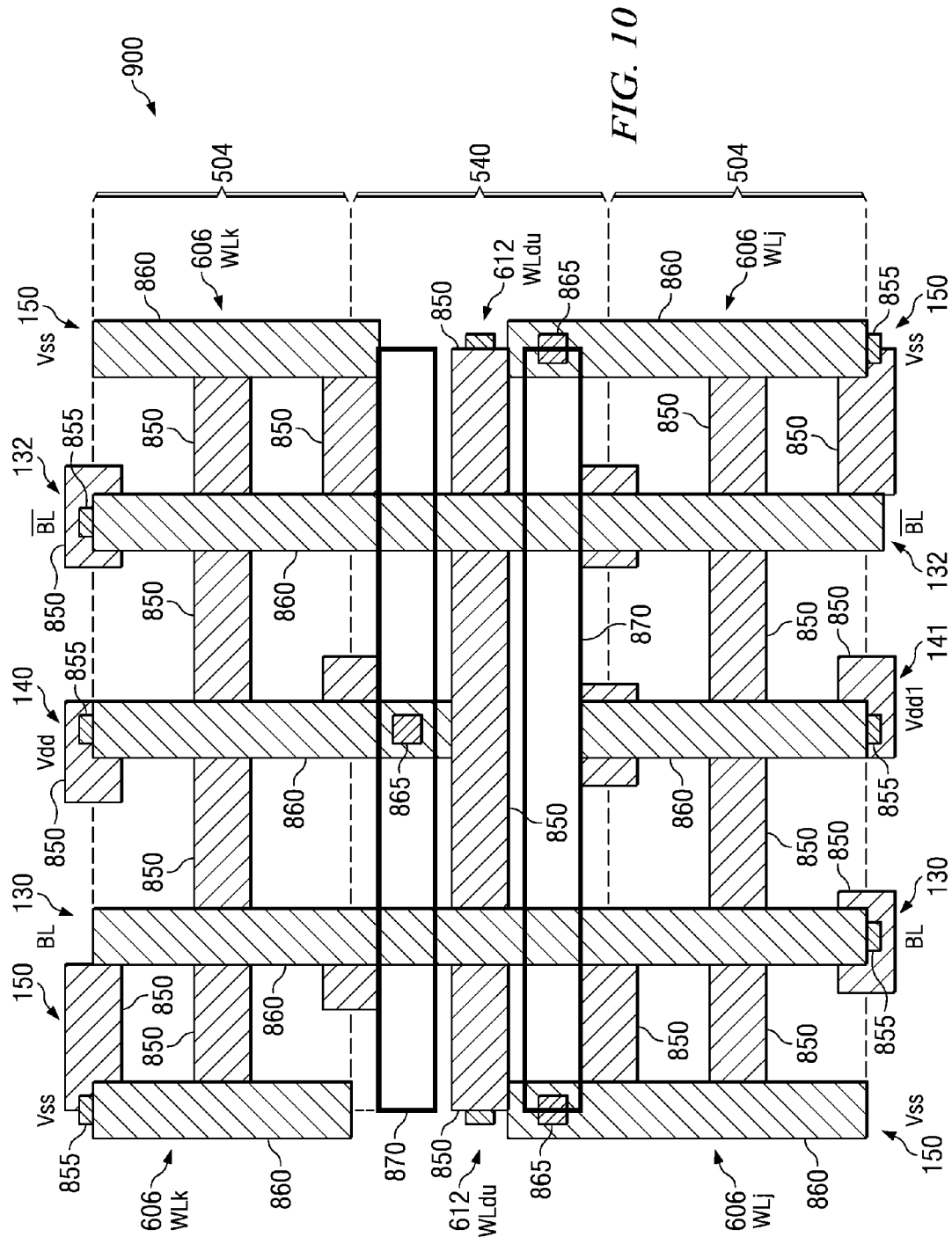
FIG. 10 is a top plan view of exemplary layout patterns of the SRAM array of FIG. 9, illustrating several more overlying metal layers that provide interconnection of the bitlines and power supply lines to the two standard array cells and the dummy cell, according to one or more aspects of the present invention, wherein the layout patterns of the array cells and the dummy cell differ at the M1 metal layer and the upper metal layers.

FIGS. 9 and 10 illustrates an exemplary layout pattern 900 of the SRAM array 802 of FIG. 8, illustrating several additional overlying metal layers that function as the wordlines, bitlines and power supply lines to the two array segment cells 504 and the dummy cell 540, according to one or more aspects of the present invention. Again, the layout patterns of the array cells 504 and the dummy cell 540 differ at the M1 metal layer 640.

Layout pattern 900 illustrates the fifth patterning layer comprising the Via1 layer 645 that permits interconnections to the upper metal layers for the power supply line interconnections, and a sixth M2 layer 850 that may be used for the wordlines WLj, WLk 606 and WLdu 612 connected to each cell by Via1 645. WLdu 612 may further be connected to Vss 150 to insure that the dummy cells 540 of the dummy cell row remain in the "off" state.

A seventh Via2 layer 855 permits connection of the M2 layer 850 to an additional M3 metal layer 860 used to provide interconnection of the bitlines, while Via3 layer 865 permits connection of the M3 layer 860 to an additional M4 metal layer 870 that may be used to provide interconnection of the power supply lines to the cells 504 of the array segments and the dummy cell 540.

Alternately, for cells with wider transistors, it is possible to run BL's 130, 132 in the M2 layer 850 conductors, and WL's 606, 612 in the M3 layer 860. With this arrangement, there can be room to run a supply line (e.g., Vdd, Vss) in the M3 layer 860 parallel to the WL of the cell. Then, the Vss can be run horizontal in the array segment cells 504, and Vdd horizontal in the dummy cell row, and not need M4. Another alternative is to have double dummy cell rows in order to have room for a supply buss in the M2 metal layer 850.

Figure 11:
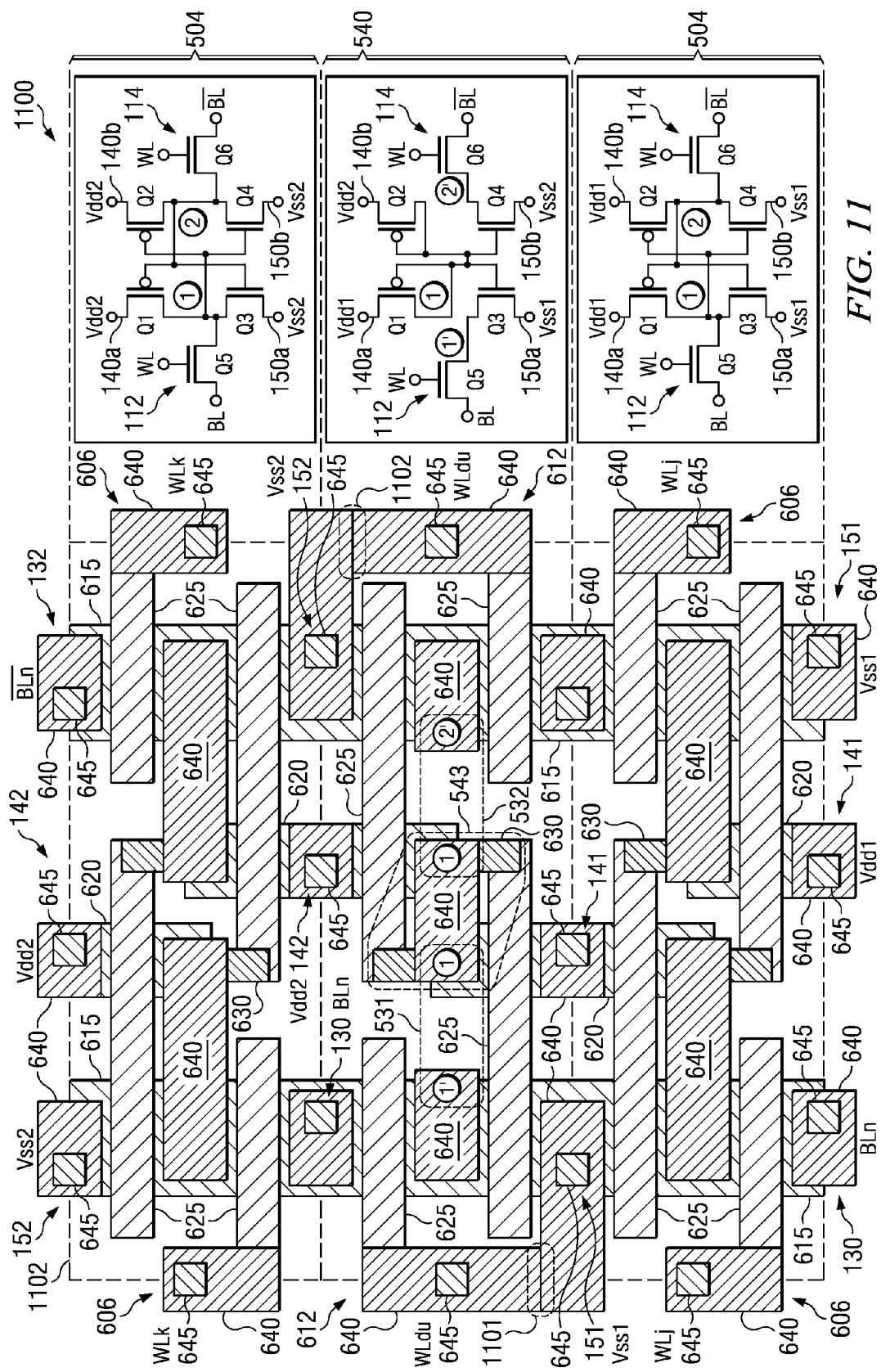
FIG. 11 is a top plan view of exemplary layout patterns and respective schematic diagrams of three cells of an SRAM array illustrating the first five patterning layers of the array that includes two standard array cells and a dummy cell patterned according to the dummy cell of FIG. 5D, one array cell of a first array segment above the dummy cell, and one array cell of a second array segment below the dummy cell according to one or more aspects of the present invention, wherein the layout patterns of the array cells and the dummy cell differ at the M1 metal layer and the dummy wordline gates are connected to Vss to keep the dummy cells turned-off.

FIG. 11 illustrates an exemplary layout pattern 1100 and respective schematic diagrams 504, 540 of three cells of an SRAM array 1102 similar to that of FIG. 8, and as such, need not be completely described again for the sake of brevity. Compared to FIG. 8, however, the dummy wordline gates WLdu 612 in the layout pattern 1100 of FIG. 11 are connected to Vss (e.g., Vss1 151) to keep the dummy cells 540 turned-off. The M1 metal layer 640 is used to short the dummy wordline gates WLdu 612 to Vss1 151 in the M1 640 shorting areas 1101 and 1102, as shown by the dotted line circles. This method of patterning liberates a horizontal line to be used as a power buss, therefore the M4 870 is not needed to supply power to the blocks as in FIG. 10.

Figure 12:
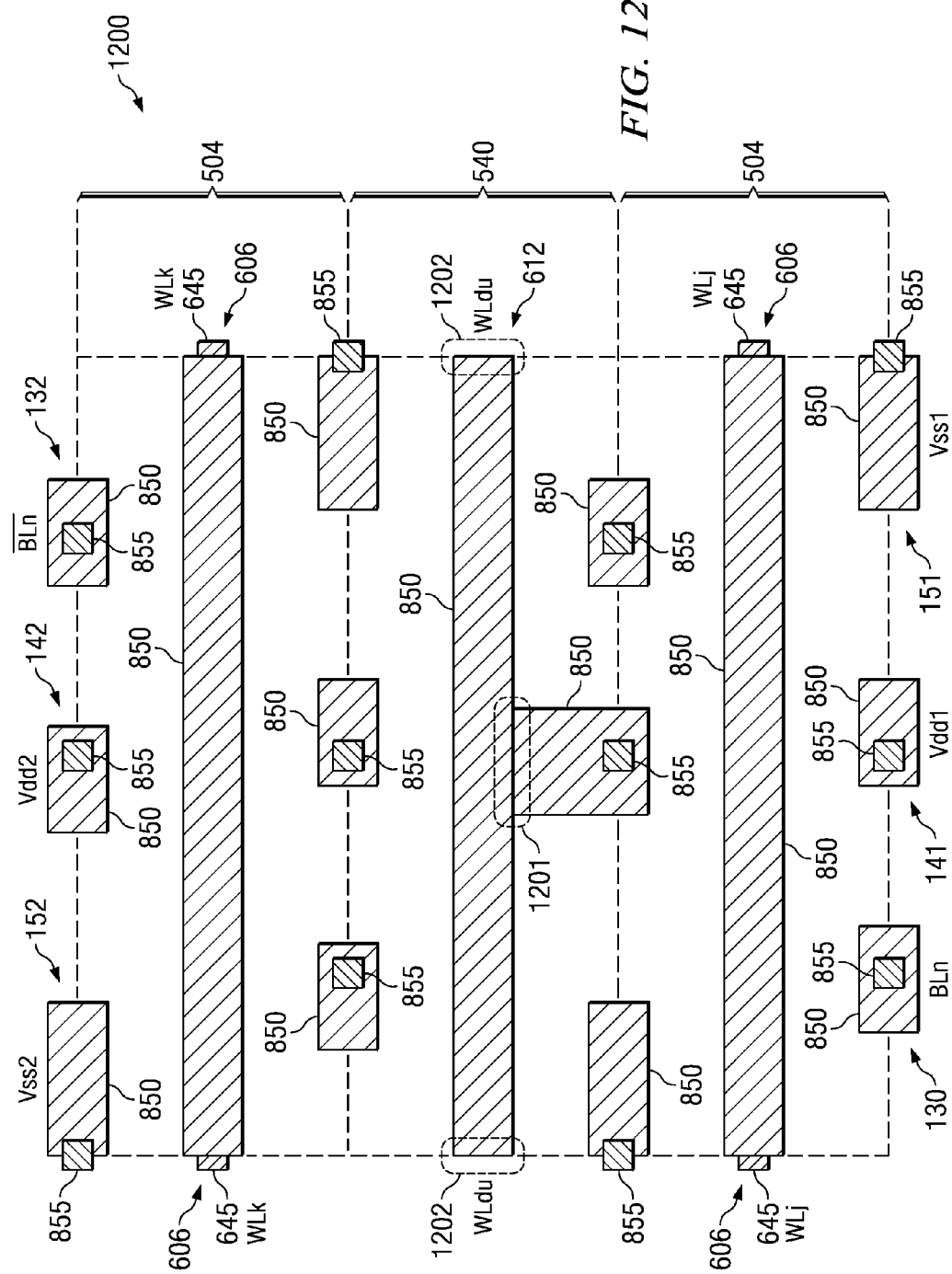
FIG. 12 is a top plan view of exemplary layout patterns of the SRAM array of FIG. 8, illustrating several overlying metal layers that function as the wordlines, bitlines and power supply lines to the two standard array cells and the dummy cell, according to one or more aspects of the present invention, wherein the layout patterns of the array cells and the dummy cell differ at the upper metal layers, and wherein the dummy cell wordline is replaced by the Vdd supply line when the Vdd is segmented and the Vss is not segmented.

FIG. 12 illustrates an alternate exemplary layout pattern 1200 of the SRAM array of FIG. 8, illustrating several overlying metal layers that function as the wordlines, bitlines and power supply lines to the two array segment cells 504 and the dummy cell 540, according to one or more aspects of the present invention. Layout pattern 1200 is similar to that of FIG. 9, but in contrast, a Vdd supply line replaces the dummy cell wordline WLdu 612 in the M2 metal layer 850, when the Vdd is segmented and the Vss is not segmented. The M2 850 shorting area 1201 is shown by a dotted line circle. The Via1 contacts 645 may be removed from the dummy cell wordline WLdu 612 as shown by dotted line circles at 1202 to isolate the wordline pass gate (select) transistors from the Vdd supply line.

Figure 13:
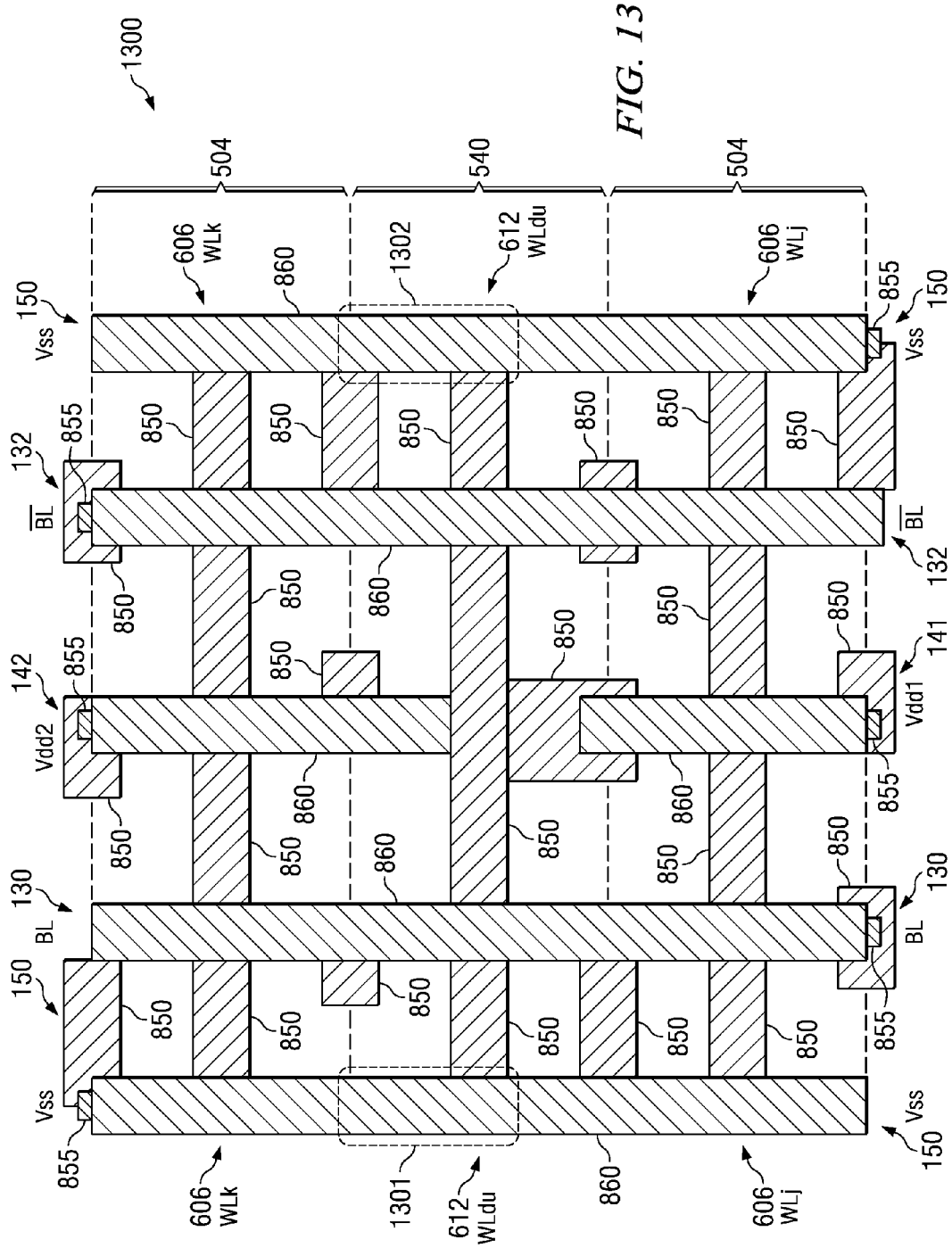
FIG. 13 is a top plan view of exemplary layout patterns of the SRAM array of FIG. 9, illustrating several more overlying metal layers that provide interconnection of the bitlines and power supply lines to the two standard array cells and the dummy cell, according to one or more aspects of the present invention, wherein the layout patterns of the array cells and the dummy cell differ at the upper metal layers, and wherein the dummy cell wordline supplies Vdd1 when the Vdd is segmented and the Vss is not segmented.

FIG. 13 illustrates another exemplary layout pattern 1300 of the SRAM array of FIG. 9, illustrating several of the overlying metal layers that provide interconnection of the bitlines and power supply lines to the two array segment cells 504 and the dummy cell 540, according to one or more aspects of the present invention. Layout pattern 1300 uses the dummy cell wordline WLdu 612 in the M2 metal layer 850 to supply Vdd1 as in FIG. 12, and uses the M3 metal layer 860 to provide Vss 150 as shown at the circled regions shorted at 1301 and 1302, when the Vdd is segmented and the Vss is not segmented.

The invention is also not limited to the use of silicon wafers, and may be implemented in association with the manufacture of various semiconductor devices, SRAM memory devices, or other such devices, wherein power consumption and peak current on power-up is an issue, where power is to be limited only to the memory area being used, wherein special OPC considerations are problematic, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. An SRAM array divided into blocks isolated by a row pattern of dummy cells, comprising:
a first and second array block each comprising an SRAM cell having a first layout configuration;
one or more of the dummy cells having a second layout configuration arranged along the row pattern associated with a wordline of the SRAM array; and
a first pair of power supply voltage lines connected to the first array block, and a second pair of power supply voltage lines connected to the second array block.

2. The array of claim 1, wherein the first and second pair of power supply voltage lines of the array blocks are connected to the one or more dummy cells.

3. The array of claim 1, further comprising bitlines that are continuous across the first and second array blocks and a dummy cell associated therewith.

4. The array of claim 1, wherein the first and second layout configurations are substantially the same.

5. The array of claim 1, wherein the first and second layout configurations are substantially the same for an active region, a gate layer, and a contact layer.

6. The array of claim 1, wherein the first layout configuration of the first and second array block comprises an SRAM configuration cell, having first and second cross-coupled inverters each comprising an NMOS and a PMOS transistor, and wherein the second layout configuration of the dummy cell comprises an SRAM configuration cell, having transistors arranged in first and second transistor pairs corresponding to the transistors of the cross-coupled inverters of the SRAM cells having the first layout configuration, each transistor pair comprising an NMOS and a PMOS transistor, and wherein the dummy cell is modified to avoid a crowbar current.

7. The array of claim 6, wherein the modification to the second layout configuration of the dummy cell that avoids the crowbar current, comprises disconnecting the drain of the NMOS transistor from the drain of the PMOS transistor within each of the first and second transistor pairs, thereby avoiding a crowbar current within each transistor pair when supply voltages applied to the first and second pair of power supply voltage lines are different.

8. The array of claim 7, wherein the modification to the second layout configuration of the dummy cell that avoids the crowbar current, further comprises connecting the drains of the PMOS transistor within each of the first and second transistor pairs, wherein the gates of the four transistors and the drains of the PMOS transistors are connected to a single node, and wherein the drain terminals of the first and second transistor pairs are not connected to one another, thereby avoiding a crowbar current within each inverter when the supply voltages applied to the first and second pair of power supply voltage lines are different.

9. The array of claim 6, wherein one or more of the interconnections of the first or second layout configurations are accomplished in a metal layer or by a contact.

10. The array of claim 6, wherein one of the first and second pair of power supply voltage line connections of the first and second layout configurations are accomplished in a metal layer.

11. The array of claim 1, wherein the wordline associated with the dummy cells is configured to provide one or more of the first and second pair of power supply voltage lines.

12. The array of claim 1, wherein the wordline associated with the dummy cells is configured to be connected to a voltage that isolates the dummy cell from a bit line.

13. The array of claim 1, wherein the first and second pair of power supply voltage lines are the same.

14. The array of claim 1, wherein at least one of said first pair of power supply voltages lines is divided from the associated one of said second pair of power supply voltages at the dummy cell.

15. The array of claim 14, wherein said at least one of said first pair of power supply voltages lines is a first Vdd power supply voltage line and wherein said associated one of said second pair of power supply voltage lines is second, separate, Vdd power supply voltage line.

16. The array of claim 1, wherein both of said first pair of power supply voltage lines are divided and isolated from the associated ones of said second pair of power supply voltage lines at said row pattern of dummy cells.

17. A dummy cell for isolating adjacent array segments of an SRAM array, comprising:
   an SRAM configuration cell, having transistors arranged in first and second transistor pairs each comprising an NMOS and a PMOS transistor, and wherein the dummy cell is modified to avoid a crowbar current; and
   a first pair of power supply voltage lines connected to the first transistor pair, and a second pair of power supply voltage lines connected to the second transistor pair of the dummy cell, wherein at least one of said first pair of power supply voltages lines is divided from the associated one of said second pair of power supply voltages at the dummy cell;
   wherein the dummy cell modification avoids the crowbar current within each transistor pair that would otherwise occur when pairs of supply voltages applied to the power supply voltage lines of the adjacent array segments are different.

18. The dummy cell of claim 17, wherein a wordline associated with the dummy cell is configured to be connected to a voltage that isolates the dummy cell from a bitline.

19. The array of claim 17, wherein the modification to the dummy cell that avoids the crowbar current, comprises disconnecting the drain of the NMOS transistor from the drain of the PMOS transistor within each of the first and second transistor pairs, thereby avoiding a crowbar current when the supply voltages applied to the first and second pair of power supply voltage lines are different.

20. The array of claim 17, wherein the modification to the dummy cell that avoids the crowbar current, further comprises connecting the drains of the PMOS transistor from each NMOS and PMOS transistor pair, wherein the gates of the four transistors and the drains of the PMOS transistors are connected to a single node, and wherein the drain terminals of the first and second transistor pairs are not connected to one another, thereby avoiding a crowbar current when the supply voltages applied to the first and second pair of power supply voltage lines are different.

21. The dummy cell of claim 17, further comprising bitlines that are continuous across a plurality of array segments and the dummy cell associated therewith.

22. The dummy cell of claim 17, wherein a layout configuration of the dummy cell is substantially the same as a layout configuration of the cells of the adjacent array segments.

23. The dummy cell of claim 17, wherein a layout configuration of the dummy cell is substantially the same as a layout configuration of the cells of the adjacent array segments for an active region, a gate layer, and a contact layer.

24. The dummy cell of claim 17, wherein a first layout configuration of the cells of the array segments comprises an SRAM configuration cell, having first and second cross-coupled inverters each comprising an NMOS and a PMOS transistor, and wherein a second layout configuration of the dummy cell comprises an SRAM type cell, having transistors arranged in first and second transistor pairs corresponding to the transistors of the cross-coupled inverters of the SRAM cells having the first layout configuration, each transistor pair comprising an NMOS and a PMOS transistor, and wherein the dummy cell is modified to avoid a crowbar current.

25. The dummy cell of claim 24, wherein one or more of the interconnections of the first or second layout configurations are accomplished in a metal layer or by a contact.

26. The dummy cell of claim 24, wherein one of the first and second pair of power supply voltage connections of the first and second layout configurations are accomplished in a metal layer.

27. The dummy cell of claim 17, wherein the wordline associated with the dummy cell is configured to provide one or more of the first and second pair of power supply voltage lines.

28. The dummy cell of claim 17, wherein the voltages on the first and second pair of power supply voltage lines are the same.

29. A dummy cell row for segmenting an SRAM array into array segments configured to couple to differing pairs of supply voltages, comprising:
   one or more of the dummy cells arranged along a row associated with a wordline of the SRAM array comprising the first and second array segment; and
   a first pair of power supply voltage lines connected to a first array segment, and a second pair of power supply voltage lines connected to a second array segment;
   wherein the dummy cell comprises an SRAM configuration cell, comprising first and second transistor pairs, each pair having an NMOS and a PMOS transistor, wherein the gates of the four transistors and the drains of the PMOS transistors are connected to a single node, and wherein the drain terminals of the PMOS and NMOS transistor pairs are not connected to one another, thereby avoiding a crowbar current within each inverter when the supply voltages applied to the first and second pair of power supply voltage lines are different;

wherein the first pair of power supply voltage lines is connected to the first transistor pair, and the second pair of power supply voltage lines is connected to the second transistor pair of the dummy cell; and wherein a wordline associated with the one or more dummy cells is configured to be connected to a voltage that isolates the dummy cell from a bitline.

30. The dummy cell of claim 19, wherein the layout configuration of the dummy cell is substantially the same as a layout configuration of the cells of the first and second array segments.

\* \* \* \* \*